United States Patent
Bailie et al.

(10) Patent No.: US 12,336,305 B1
(45) Date of Patent: Jun. 17, 2025

(54) PHOTOVOLTAIC CELLS WITH BYPASS DIODES

(71) Applicant: Tandem PV, San Jose, CA (US)

(72) Inventors: Colin David Bailie, Morgan Hill, CA (US); Chris Eberspacher, Palo Alto, CA (US)

(73) Assignee: Tandem PV

( * ) Notice: Subject to any disclaimer, the term of this patent is extended or adjusted under 35 U.S.C. 154(b) by 0 days.

(21) Appl. No.: 18/793,358

(22) Filed: Aug. 2, 2024

Related U.S. Application Data

(60) Provisional application No. 63/544,141, filed on Oct. 13, 2023.

(51) Int. Cl.
| | | |
|---|---|---|
| *H10F 19/75* | (2025.01) | |
| *H10F 19/90* | (2025.01) | |
| *H10F 71/00* | (2025.01) | |
| *H10F 77/80* | (2025.01) | |

(52) U.S. Cl.
CPC .......... *H10F 19/75* (2025.01); *H10F 19/902* (2025.01); *H10F 71/00* (2025.01); *H10F 77/80* (2025.01)

(58) Field of Classification Search
CPC ......... H10F 19/75; H10F 19/902; H10F 77/80
See application file for complete search history.

(56) References Cited

U.S. PATENT DOCUMENTS

| | | |
|---|---|---|
| 5,330,583 A | 7/1994 | Asai et al. |
| 5,811,833 A * | 9/1998 | Thompson ............ H10K 85/60 313/504 |
| 6,013,870 A | 1/2000 | Psyk et al. |
| 6,103,970 A | 8/2000 | Kilmer et al. |
| 6,274,804 B1 | 8/2001 | Psyk et al. |
| 6,278,054 B1 | 8/2001 | Ho et al. |
| 6,316,716 B1 | 11/2001 | Hilgrath |
| 6,326,540 B1 | 12/2001 | Kilmer et al. |
| 6,359,210 B2 | 3/2002 | Ho et al. |
| 6,552,259 B1 | 4/2003 | Hosomi et al. |
| 6,600,100 B2 | 7/2003 | Ho et al. |
| 6,617,508 B2 | 9/2003 | Kilmer et al. |
| 6,635,507 B1 | 10/2003 | Boutros et al. |
| 6,680,432 B2 | 1/2004 | Sharps et al. |
| 6,864,414 B2 | 3/2005 | Sharps et al. |
| 7,115,811 B2 | 10/2006 | Ho et al. |
| 7,592,538 B2 | 9/2009 | Sharps et al. |

(Continued)

FOREIGN PATENT DOCUMENTS

| | | |
|---|---|---|
| EP | 0535614 A3 | 2/1994 |
| EP | 1110247 A1 | 6/2001 |

(Continued)

*Primary Examiner* — Golam Mowla
(74) *Attorney, Agent, or Firm* — Patterson + Sheridan, LLP

(57) ABSTRACT

Embodiments of the disclosure include a photovoltaic device comprising a plurality of photovoltaic cells coupled in series. The photovoltaic cells comprising a first contact layer, a first charge transport layer (CTL) disposed over the first contact layer, an absorber layer disposed over the first CTL, a second CTL disposed over the absorber layer; and a second contact layer disposed over the second CTL. Each photovoltaic cell in the plurality of photovoltaic cells includes a diode region, the diode region comprises a feature that extends through the absorber layer and comprises the first CTL and the second CTL.

20 Claims, 15 Drawing Sheets

(56) References Cited

U.S. PATENT DOCUMENTS

| | | | |
|---|---|---|---|
| 7,732,705 | B2 | 6/2010 | Stan et al. |
| 7,759,572 | B2 | 7/2010 | Sharps et al. |
| 7,932,462 | B2 | 4/2011 | Van Riesen et al. |
| 8,263,853 | B2 | 9/2012 | Varghese |
| 8,263,855 | B2 | 9/2012 | Sharps et al. |
| 8,563,347 | B2 | 10/2013 | Lu et al. |
| 8,586,859 | B2 | 11/2013 | Varghese |
| 8,704,085 | B2 | 4/2014 | Lockenhoff |
| 9,178,095 | B2 | 11/2015 | Hennessy et al. |
| 9,219,171 | B2 | 12/2015 | Moslehi |
| 9,627,565 | B2 | 4/2017 | Hoang et al. |
| 10,566,559 | B2 * | 2/2020 | Ding .................. H10K 30/20 |
| 11,329,177 | B2 | 5/2022 | Bush |
| 11,631,777 | B2 | 4/2023 | Bush |
| 11,728,450 | B2 | 8/2023 | Bush |
| 2004/0040593 | A1 | 3/2004 | Ho et al. |
| 2004/0149331 | A1 | 8/2004 | Sharps et al. |
| 2006/0042684 | A1 | 3/2006 | Sharps et al. |
| 2007/0079863 | A1 | 4/2007 | Stan et al. |
| 2007/0107772 | A1 | 5/2007 | Meck et al. |
| 2010/0031994 | A1 | 2/2010 | Varghese |
| 2010/0078057 | A1 | 4/2010 | Karg et al. |
| 2010/0147372 | A1 | 6/2010 | Meck et al. |
| 2010/0282291 | A1 * | 11/2010 | Goto ................ H01L 31/03921 257/E31.113 |
| 2011/0025212 | A1 * | 2/2011 | Kolosov ................ H10K 59/00 438/22 |
| 2011/0265857 | A1 | 11/2011 | Wang et al. |
| 2012/0055544 | A1 * | 3/2012 | Ahn ........................ H10F 19/35 438/93 |
| 2013/0014803 | A1 | 1/2013 | Varghese |
| 2015/0364631 | A1 | 12/2015 | Aiken et al. |
| 2016/0196927 | A1 * | 7/2016 | Bryant .................. H10K 39/10 438/66 |
| 2017/0338361 | A1 | 11/2017 | Xiong et al. |
| 2019/0165275 | A1 * | 5/2019 | Kasmai .................. H10K 71/13 |
| 2020/0295209 | A1 | 9/2020 | Bush |
| 2021/0408123 | A1 * | 12/2021 | Di Giacomo .......... H10K 39/10 |
| 2022/0173263 | A1 * | 6/2022 | Arai ........................ H10F 19/37 |
| 2023/0096010 | A1 * | 3/2023 | Bush .................. H01L 31/0504 136/255 |
| 2023/0298826 | A1 | 9/2023 | Gotanda et al. |
| 2024/0212946 | A1 | 6/2024 | Eperon et al. |

FOREIGN PATENT DOCUMENTS

| | | |
|---|---|---|
| EP | 0971417 A3 | 2/2005 |
| EP | 1125331 B1 | 8/2010 |
| EP | 2226850 A1 | 9/2010 |
| EP | 2101357 A3 | 2/2012 |
| EP | 1775778 B1 | 3/2012 |
| EP | 1788628 B1 | 1/2014 |
| EP | 3301727 A1 | 4/2018 |
| EP | 2412032 B1 | 8/2020 |
| WO | 2000011724 A1 | 3/2000 |
| WO | 2003012880 A2 | 2/2003 |
| WO | 2003054926 A2 | 7/2003 |
| WO | 2023056209 A1 | 4/2023 |
| WO | 2024102694 | 5/2024 |

\* cited by examiner

PHOTOVOLTAIC CELLS WITH BYPASS DIODES

BACKGROUND

Field

Embodiments of the present invention generally relate to solar cells and methods of manufacturing thereof.

Description of the Related Art

Perovskite photovoltaic (PV) cells, also generally referred to as perovskite solar cells, have attracted attention in the solar cell industry for their high conversion efficiencies. Yet for commercialization of the technology, full modules, not just individual cells, must exhibit long term durability/ stability in each installation location.

A common field failure mode for thin-film photovoltaic (PV) cells is partial shading, which can cause two different types of premature device failures. A first failure type, which is quite common to most solar technologies, is often referred to as "hot-spot generation", which can cause localized PV cell failures. A second failure more specifically problematic for perovskite is the inversion of the electrical field in the solar during a shading event, which can cause electrochemical-type failures in the perovskite absorber layer material itself. A compounding problem for perovskite PV cell containing photovoltaic panels is the difficulty of incorporating bypass diodes into the module architecture, which is partially why some PV cell manufacturers are not utilizing bypass diodes in their PV cell device structures.

Therefore, there is a need in the art for a PV cells and PV modules that can solve the problems described above.

SUMMARY

According to one or more embodiments, a photovoltaic device includes a plurality of photovoltaic cells coupled in series, the photovoltaic cells including a first contact layer, a first charge transport layer (CTL) disposed over the first contact layer, an absorber layer disposed over the first CTL, a second CTL disposed over the absorber layer; and, a second contact layer disposed over the second CTL, wherein each photovoltaic cell in the plurality of photovoltaic cells includes a diode region, the diode region comprises a feature that extends through the absorber layer and comprises the first CTL and the second CTL.

According to one or more embodiments, a photovoltaic device includes a plurality of photovoltaic cells coupled in series, the photovoltaic cells including a first contact layer, a first charge transport layer (CTL) disposed over the first contact layer, an absorber layer disposed over the first CTL, a second CTL disposed over the absorber layer; and a second contact layer disposed over the second CTL, wherein each photovoltaic cell in the plurality of photovoltaic cells includes a diode region, the diode region comprises a feature that extends through the absorber layer and comprises the first CTL in direct contact with the second CTL.

According to one or more embodiments, a photovoltaic device includes a photovoltaic device comprising a plurality of photovoltaic cells coupled in series. Each of the photovoltaic cells comprise: a first contact layer; a first charge transport layer (CTL) disposed over the first contact layer; an absorber layer disposed over the first CTL; a second charge transport layer (CTL) disposed over the absorber layer; and a second contact layer disposed over the second CTL. Each photovoltaic cell in the plurality of photovoltaic cells includes a diode region that comprises a feature comprising trench, circular or oval shaped structures, and the feature extends through the absorber layer and comprises the first CTL and the second CTL.

Embodiments of the disclosure also include a photovoltaic device comprising a first photovoltaic cell and a second photovoltaic cell. The first photovoltaic cell, comprises: a first portion of a first contact layer; a first portion of a first charge transport layer (CTL) disposed over the first portion of the first contact layer; a first portion of an absorber layer disposed over the first portion of the first CTL; a first portion of a second charge transport layer (CTL) disposed over the first portion of the absorber layer; and a first portion of a second contact layer disposed over the first portion of the second CTL. The second photovoltaic cell, comprising: a second portion of the first contact layer; a second portion of the first charge transport layer (CTL) disposed over the second portion of the first contact layer; a second portion of the absorber layer disposed over the second portion of the first CTL; a second portion of the second charge transport layer (CTL) disposed over the second portion of the absorber layer; and a second portion of the second contact layer disposed over the second portion of the second CTL. The photovoltaic device also comprises: a first P1 scribe line disposed between the first and second portions of the first contact layer; a first P3 scribe line extending through the first portion of the first CTL, the first portion of the absorber layer, the first portion of the second CTL, and the first portion of the second contact layer; and one or more first diode regions. The one or more first diode regions each comprise a feature that is positioned between the first P3 scribe line and the first P1 scribe line, the one or more first diode regions extend through the first portion of the absorber layer, and the one or more first diode regions comprise the first CTL and the second CTL.

According to one or more embodiments, a method includes depositing a portion of a first contact layer over a first substrate layer, depositing a portion of a first charge transport layer (CTL) over the first contact layer, depositing a portion of an absorber layer over the first CTL, and forming one or more diode regions. The forming of the one or more diode regions includes forming a plurality of features that extend through the portion of the absorber layer, and depositing a portion of a second CTL over the absorber layer after forming the plurality of features, wherein each feature of the plurality of features comprises the first CTL and the second CTL.

According to one or more embodiments, a method includes depositing a portion of a first contact layer over a first substrate layer, depositing a portion of a first charge transport layer (CTL) over the first contact layer, depositing a portion of an absorber layer over the first CTL, and forming one or more diode regions. The forming of the one or more diode regions includes forming a plurality of features that extend through the portion of the absorber layer, wherein forming each feature of the plurality of features comprises forming a dot that comprises a circular or oval shaped structure, and depositing a portion of a second CTL over the absorber layer after forming the plurality of features, wherein each feature of the plurality of features comprises the first CTL and the second CTL According to one or more embodiments, a method includes depositing a portion of a first contact layer over a first substrate layer, depositing a portion of a first charge transport layer (CTL) over the first contact layer, depositing a portion of an absorber layer over the first CTL, and forming one or more diode regions. The forming of the one or more diode regions includes forming a plurality of features that extend through the portion of the absorber layer, wherein forming each feature of the plurality of features comprises forming a scribe line that comprises a trench shaped structure, and depositing a portion of a second CTL over the absorber layer after forming the plurality of features, wherein each feature of the plurality of features comprises the first CTL and the second CTL.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Perovskite photovoltaic (PV) cells are increasing in use due to their high conversion efficiencies. However, one issue that photovoltaic (PV) cells, or solar cells, in general face is premature failures due to partial shading of sun light during operation. As noted above, partial shading of a perovskite PV cell can cause local failures due to hot-spot generation. Partial shading of a perovskite PV cell can also cause an inversion of the electric field within the cell resulting in electrochemical-type failures in the perovskite itself.

When a multi-PV cell panel, which includes a plurality of PV cells connected in series, if one PV cell is significantly shaded from the sun, the same amount of current flowing through the connected series of PV cells is forced through that shaded PV cell. Because the shaded cell is not generating a sufficient photocurrent to supply the necessary current, the shaded PV cell has to find the extra current by switching into a negative bias. At minimal amounts of shading, PV cells may reach the needed current level through shunt pathways, limiting the magnitude of the negative voltage. However, perovskite containing PV cells/panels, as one example of a PV cell/panel, are exemplified by a high shunt resistance, so the shunt pathways are not easily accessible. At larger amounts of shading, the materials in a shaded PV cell will electrically breakdown in order to allow the necessary current to pass through the shaded PV cell.

In typical PV cells, bypass diodes are incorporated in the module architecture to protect against the problems caused by shading. However, bypass diodes are difficult to implement into thin-film modules (e.g., perovskite PV cells). Thus, in some embodiments, due to the difficulty in integrating bypass diodes into perovskite PV modules, the complexities of integrating module-edge diodes into the semi-transparent panel architectures found in perovskite PV cells, and with the particularly susceptibilities of the materials used to form perovskite PV cells to irreversible electrochemical-type degradation, there is a need for a way to shunt the PV module generated current within the thin-film structure itself.

Embodiments herein relate to device configurations and methods of incorporating thin-film diodes in parallel with the main diode-like structure formed in perovskite PV cells to prevent one or more portions of a perovskite PV cell within a PV module from becoming damaged (e.g., material breakdown) during a shading event.

Figure 1:
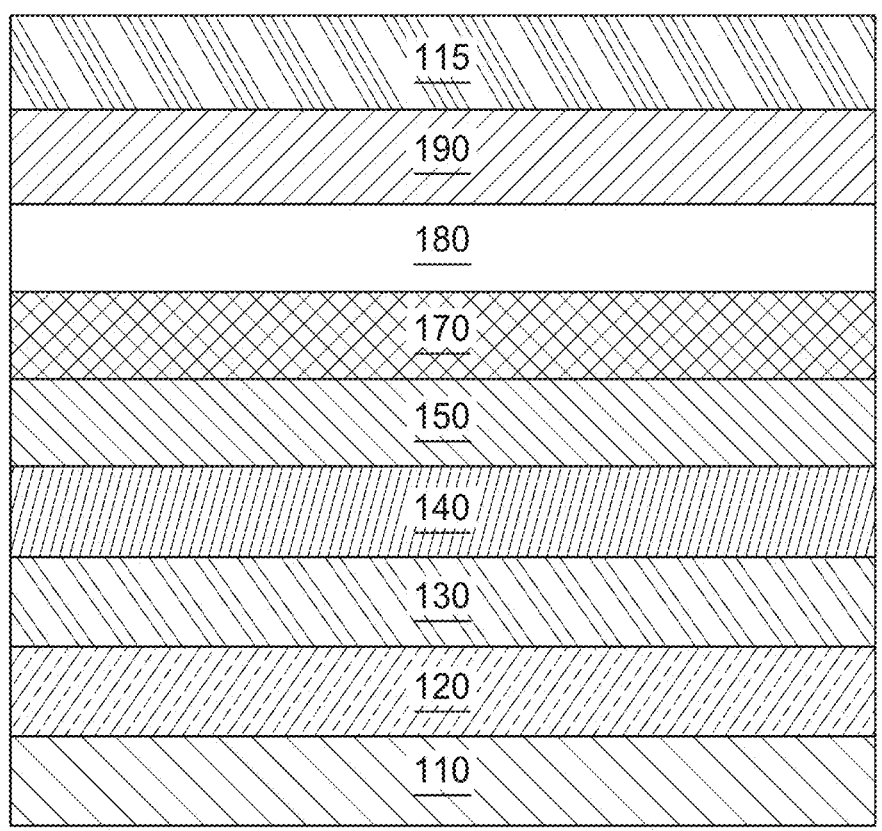
FIG. 1 illustrates a photovoltaic (PV) cell device stack that includes multiple layers that may be used in a fully functioning PV cell and/or PV module.

FIG. 1 illustrates an example of a photovoltaic device stack that includes multiple layers that may be used in a fully functioning PV cell and/or PV module. In some embodiments of the present disclosure, a device 100, (e.g., a PV cell) may include, in order, a first substrate layer 110, a first contact layer 120, a first charge transport layer (CTL) 130, an absorber layer 140 (e.g., a perovskite layer), a second charge transport layer (CTL) 150, a second contact layer 170, an optional one or more barrier layers 180, an encapsulation layer 190, and a second substrate layer 115. To facilitate understanding, identical reference numerals have been used, where possible, to designate identical elements that are common to the figures. It is contemplated that elements and features of one embodiment may be beneficially incorporated in other embodiments without further recitation.

Referring again to FIG. 1, the device 100 illustrated may include a portion of a PV cell, versus a module, in that the device shown may have no scribe lines, such that scribe lines often separate the absorber layer and/or other layers into individual cells on the module.

The device 100, described herein may be a multilayer, stacked device that can include p-i-n or n-i-p type configuration. In one example, a PV cell may include, in order, a first charge transport layer (CTL) 130 that is a hole-transport-layer (HTL), an absorber layer 140 (e.g., a perovskite layer), a second charge transport layer (CTL) 150 that is an electron-transport-layer (ETL), a second contact layer 170, and an optional one or more barrier layers 180. In another example, a PV cell may include, in order, a first charge transport layer (CTL) 130 that is an electron-transport-layer (ETL), an absorber layer 140 (e.g., a perovskite layer), a second charge transport layer (CTL) 150 that is a hole-transport-layer (HTL), a second contact layer 170, and an optional one or more barrier layers 180.

Figure 2:
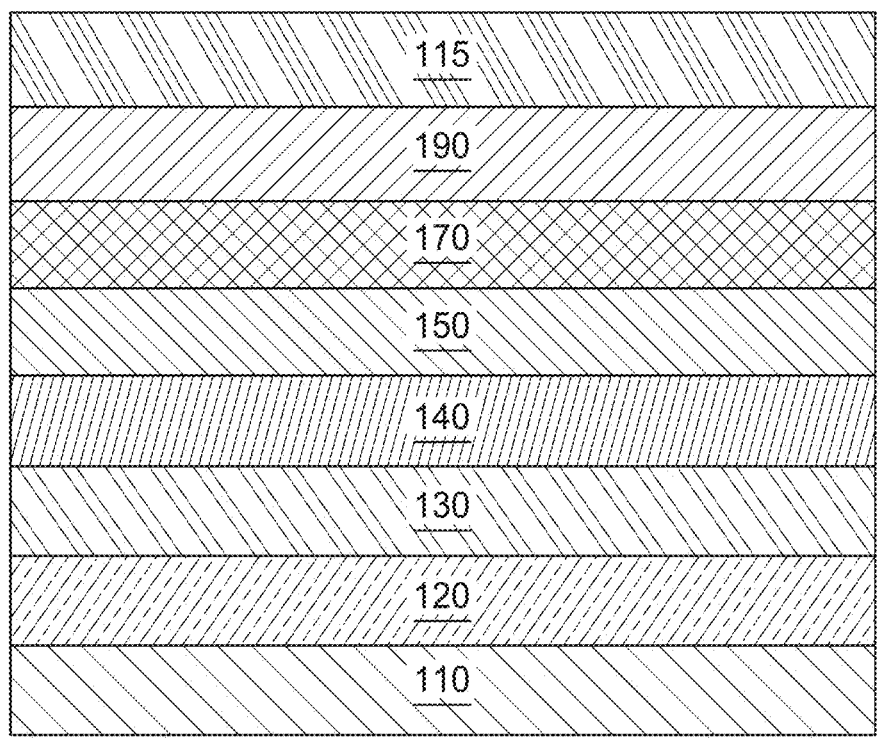
FIG. 2 illustrates a simplified photovoltaic (PV) stack that includes multiple layers that may be used in a fully functioning PV cell and/or PV module.

FIG. 2 illustrates another example PV device stack that includes multiple layers that may be used in a fully functioning PV cell and/or PV module. As illustrated in FIG. 2, the one or more barrier layers 180 were optionally removed. For example, the device 100 may include, in order, the first substrate layer 110, the first contact layer 120, the first CTL 130, the absorber layer 140, the second CTL 150, the second contact layer 170, the encapsulation layer 190, and the second substrate layer 115.

As described above, due to the difficulty in integrating bypass diodes in perovskite PV cells, the complexities of integrating module-edge diodes into semi-transparent panel architectures, and the particularly susceptibilities of perovskites to irreversible degradation, conventional bypass diodes cannot be used to shunt a PV module's generated current around shaded perovskite areas. Therefore, embodiments herein relate to shunting current around shaded perovskite areas by incorporating diode regions (i.e., perovskite-free thin-film diodes) in electrical parallel with the main perovskite diode (i.e., the absorber layer 140).

Photovoltaic Device Examples

Figure 3A:
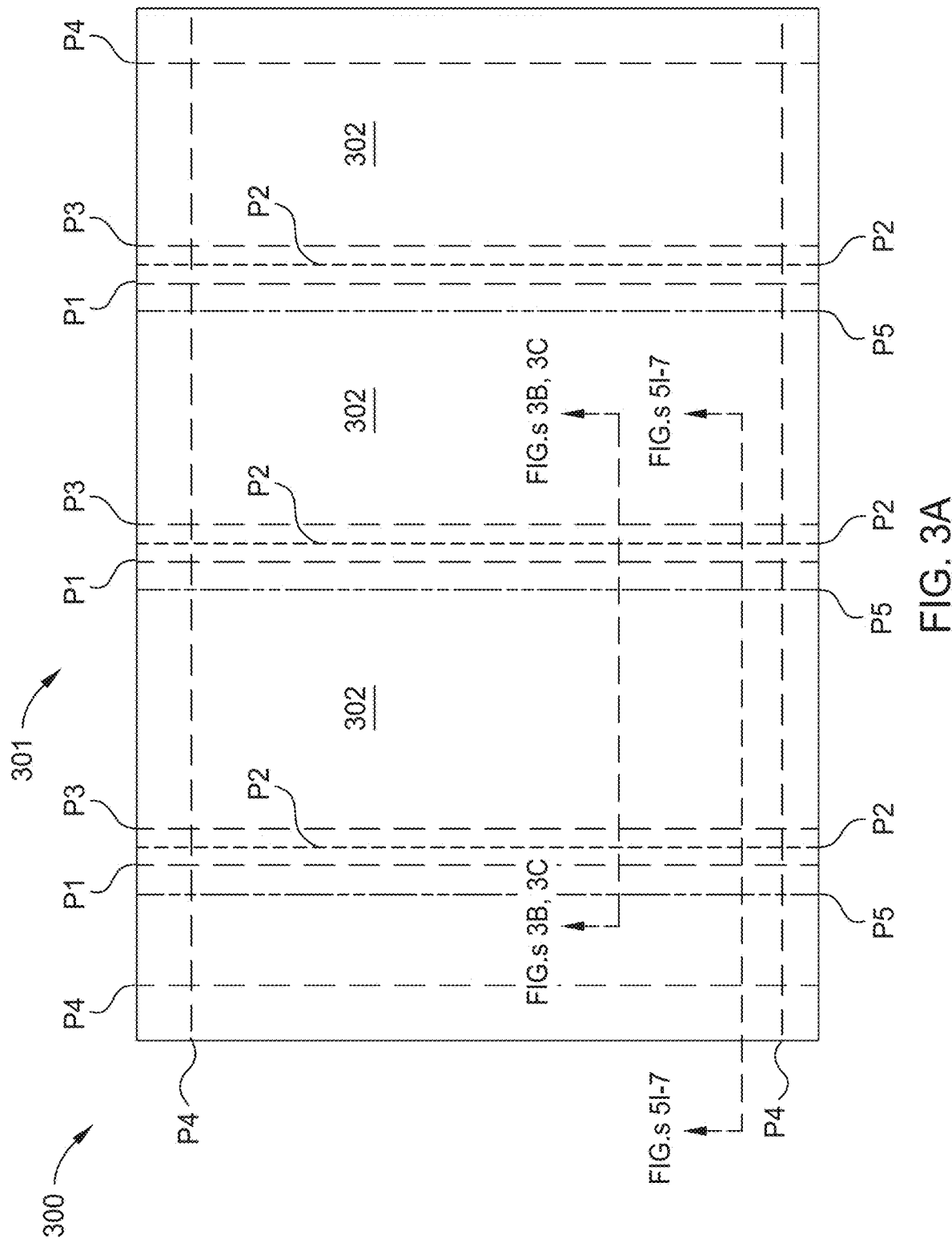
FIG. 3A illustrates a schematic plan view of a photovoltaic (PV) module that includes an array of PV cells according to one or more embodiments.
Figure 3B:
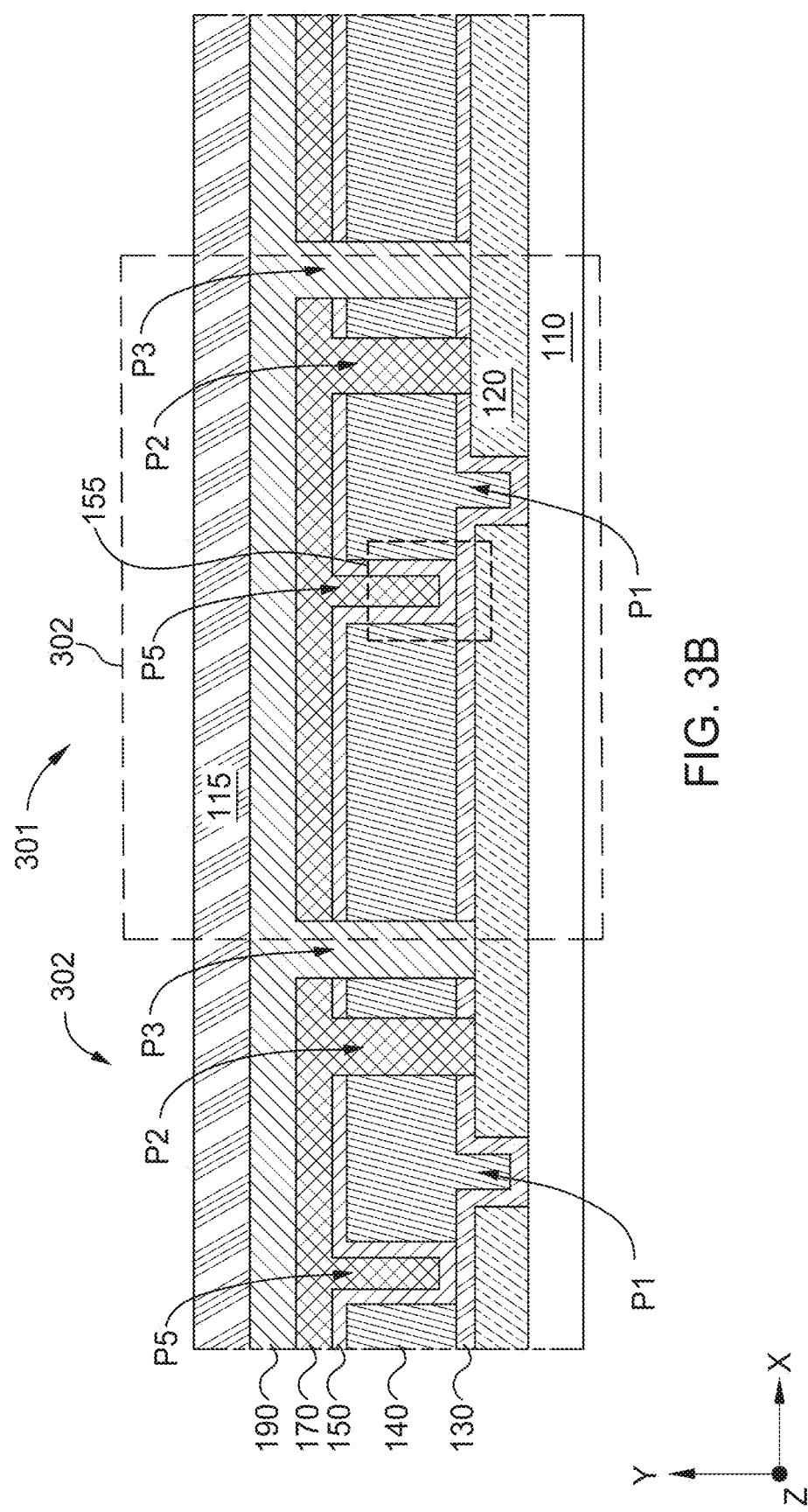
FIG. 3B illustrates a schematic side cross-sectional view of a portion of the array of PV cells of FIG. 3A according to one or more embodiments.
Figure 3C:
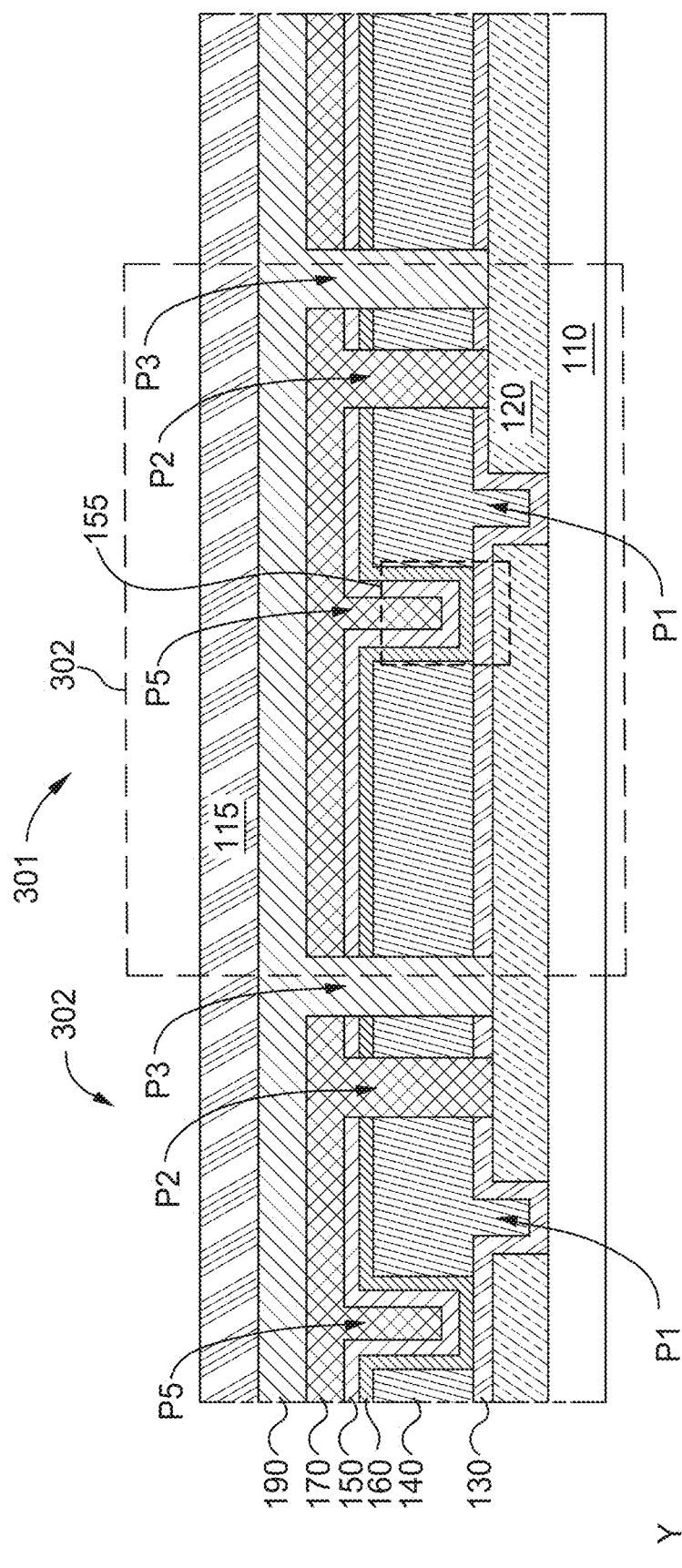
FIG. 3C illustrates a schematic side cross-sectional view of a portion of an alternately configured array of PV cells according to one or more embodiments.

FIG. 3A illustrates a schematic plan view of a photovoltaic device 300, which is also referred to herein as a photovoltaic device 300, that includes a photovoltaic device array 301 according to one or more embodiments. The photovoltaic device array 301 includes a plurality of series connected photovoltaic (PV) cells 302. The photovoltaic device array 301 includes a plurality of features, such as a plurality of first scribe lines P1, a plurality of second scribe lines P2, a plurality of third scribe lines P3 that are used to form the series connected PV cells 302, a plurality of fourth scribe lines P4 that are used to separate and isolate the series connected PV cells 302 from the edge regions of the photovoltaic device 300, and a plurality of features P5. While FIG. 3A illustrates the plurality of features P5 as having a generally linear configuration, as will be described further below, this configuration is not intending to limit the scope of the disclosure provided herein. In one or more examples, the plurality of features P5 are included in a diode region 155 (FIGS. 3B-3C and FIGS. 3E-3F) of a PV cell 302 that are used to shunt current around shaded perovskite areas. In some embodiments, the features P5 may be scribe lines (FIGS. 3A-3C). In one example, the features P5 are scribe lines that include a trench or slot shaped structure (e.g., U-shaped structure) that have a bottom region and two opposing sidewalls that extend the length of the formed trench or slot and extend through at least a portion of an absorber layer. Alternatively, the features P5 may include trench, circular, oval or slot, or other similar geometrically shaped regions, such as dots illustrated in FIG. 3D-3F. In some embodiments, the fourth scribe lines P4 surround the photovoltaic device array 301.

FIG. 3B illustrates a schematic side cross-sectional view of a portion of the photovoltaic device array 301, which includes a sectioned portion of the photovoltaic device array 301 formed by the sectioning line 3B-3B shown in FIG. 3A. The sectioned portion of the photovoltaic device array 301 shown in FIG. 3B illustrates a configuration of a plurality of features, such as the first scribe line P1, the second scribe line P2, the third scribe line P3, the fourth scribe line P4, and the features P5 as described further below. The photovoltaic device array 301, shown in FIG. 3B, includes the first substrate layer 110, the first contact layer 120, the first CTL 130, the absorber layer 140, the second CTL 150, the second contact layer 170, a plurality of features P5, the encapsulation layer 190, and the second substrate layer 115. In some embodiments, as shown in FIG. 3B, the photovoltaic device array 301 includes PV cells 302 that each include a diode region 155 in the one or more features P5 formed therein. In some embodiments, each of the features P5 extends at least through the absorber layer 140.

Because the feature P5 extends through the absorber layer 140, the diode region 155 is free of the absorber layer material, such as a region that is free of perovskite material. For example, as shown In FIG. 3B, the diode regions 155 (i.e., only one highlighted in FIG. 3B) formed within each feature P5 may include in order, from bottom-to-top, the first contact layer 120, the first charge transport layer (CTL) 130, the second charge transport layer (CTL) 150, and the second contact layer 170.

Advantageously, the diode region 155 forms a heterojunction diode region. The absence of the absorber layer 140 (i.e., perovskite) allows for the second charge transport layer (CTL) 150 to be disposed on the first charge transport layer (CTL) 130. For example, the materials of the second CTL 150 and the first CTL 130 may be in direct contact, such that they form a diode. The absence of the absorber layer 140 prevents the diode region 155 from absorbing light and shifting Fermi level which results in a smaller turn-on and breakdown voltage and a lower internal diode resistance in comparison with a full perovskite PV cell (i.e., device 100). The diode region 155 can be formed electrically in parallel with the adjacent portions of the absorber layer 140 in the device 100 so the operating current is passed through the diode region 155 during a shading event which prevents, minimizes, and/or slows the reverse-bias degradation of the material within the current generating portions of perovskite PV cells 302 (i.e., device 100), which are generally formed in a region of the absorber layer 140 disposed between a P3 scribe and a P1 scribe of each PV cell 302.

In some embodiments, the feature P5 may be formed by a patterning step, including, but not limited to, mechanical or laser scribing, removal of a portion of the absorber layer, or the like. As will be discussed further below, in some embodiments, process of forming the features P5 includes a laser scribing or mechanical scribing process that is performed after the absorber layer 140 has been deposited over the first CTL 130, and the laser scribing or mechanical scribing process is configured to substantially remove the absorber layer 140 while leaving a significant portion of the first CTL 130 remaining at the bottom of the formed laser scribed or mechanical scribed opening. In another embodiment, if the first CTL 130 comprises a multilayer stack of different CTL materials, the patterning step may be used to also remove a portion of at least one of the layers of the multilayer stack of different CTL materials in the first CTL 130.

Although each of the photovoltaic cells 302 is illustrated as having one feature P5 (i.e., diode region 155), any suitable quantity and/or size of features P5 that limits the loss to the current generating area, or absorption area which affects the geometric fill factor and open circuit voltage, due to the presence of the features P5 within each corresponding photovoltaic cell 302 while still being able to pass the full operational current generated within the photovoltaic device array 301 during a shading event during operation of the photovoltaic device array 301. The quantity and/or size of features P5 also needs to be large enough so that when the PV cell 302 is in reverse bias the generated bias is less than the breakdown voltage of the absorber layer 140 or at some other negative voltage in which the absorber layer 140 (perovskite) will not experience irreversible damage.

FIG. 3C illustrates a schematic side cross-sectional view of a portion of an alternately configured photovoltaic device array 301, which includes a sectioned portion of the photovoltaic device array 301 formed by the sectioning line 3C-3C shown in FIG. 3A. The sectioned portion of the photovoltaic device array 301 shown in FIG. 3C illustrates an alternate configuration which similarly includes the plurality of features illustrated and described in relation to FIG. 3B. In some embodiments, the photovoltaic device array 301, shown in FIG. 3C, additionally includes a buffer layer 160 that can be disposed between the absorber layer 140 and second CTL 150. In other embodiments the buffer layer 160 may be disposed between the second CTL 150 and the second contact layer 170.

In one or more embodiments, if the buffer layer 160 is included the buffer layer 160 may also be included in the diode region 155. For example, in the configuration of FIG. 3C in which the feature P5 extends at least partially through the absorber layer 140, the buffer layer 160 is included in the diode region 155.

Figure 3D:
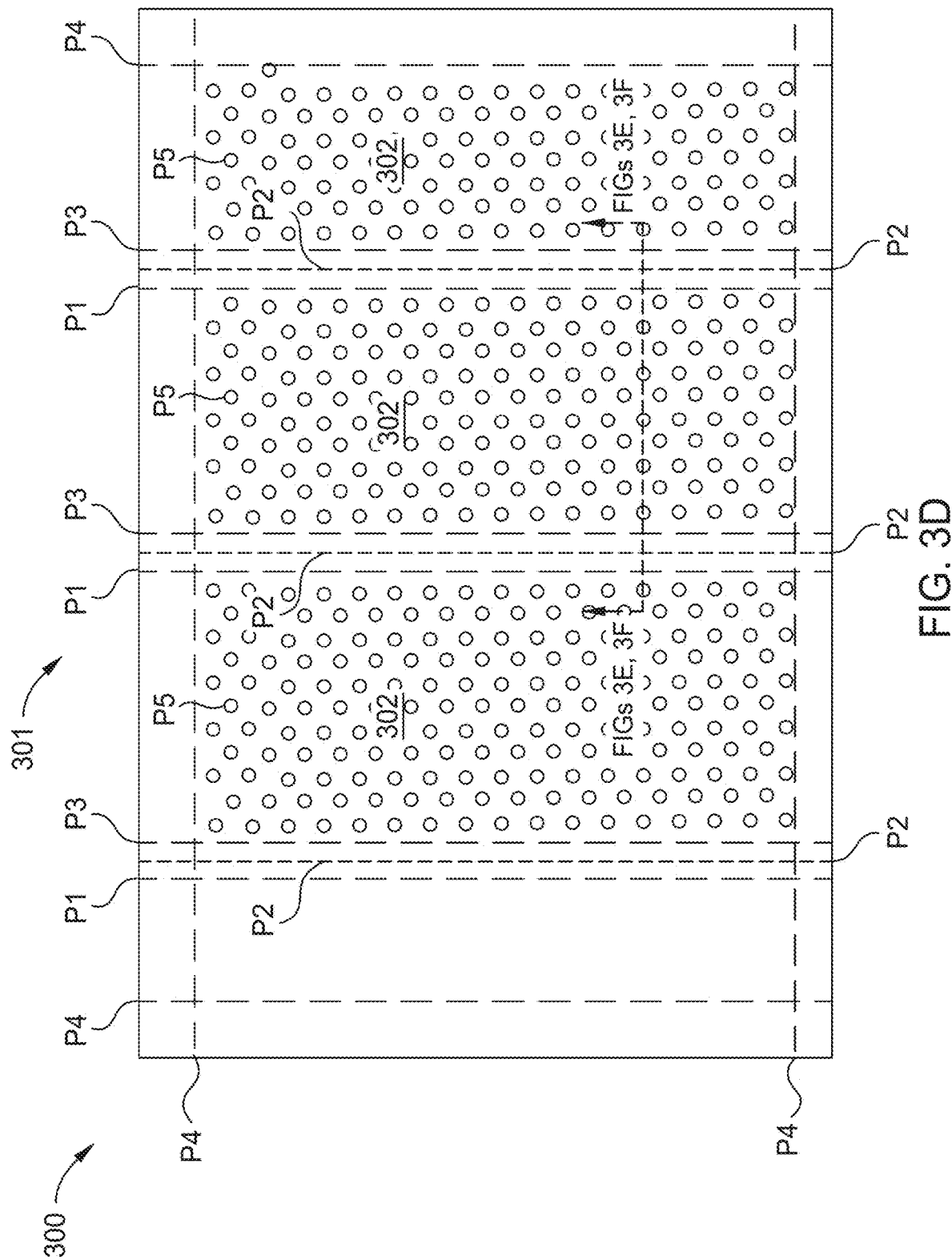
FIG. 3D illustrates a schematic plan view of an alternate photovoltaic (PV) module design that includes an array of PV cells according to one or more embodiments.

FIG. 3D illustrates a schematic plan view of a photovoltaic device 300 that includes a photovoltaic device array 301 according to one or more embodiments in which the features P5 are implemented as an array of dots that each form a diode region 155 within each of the current generating areas of each PV cell 302. While the dots illustrated in FIG. 3D are circular shaped this configuration is not intended to be limiting as to the scope of the disclosure provided herein. As shown in FIG. 3D, the features P5 are distributed across the current generating areas of the photovoltaic device array 301 in the X-Y plane.

Figure 3E:
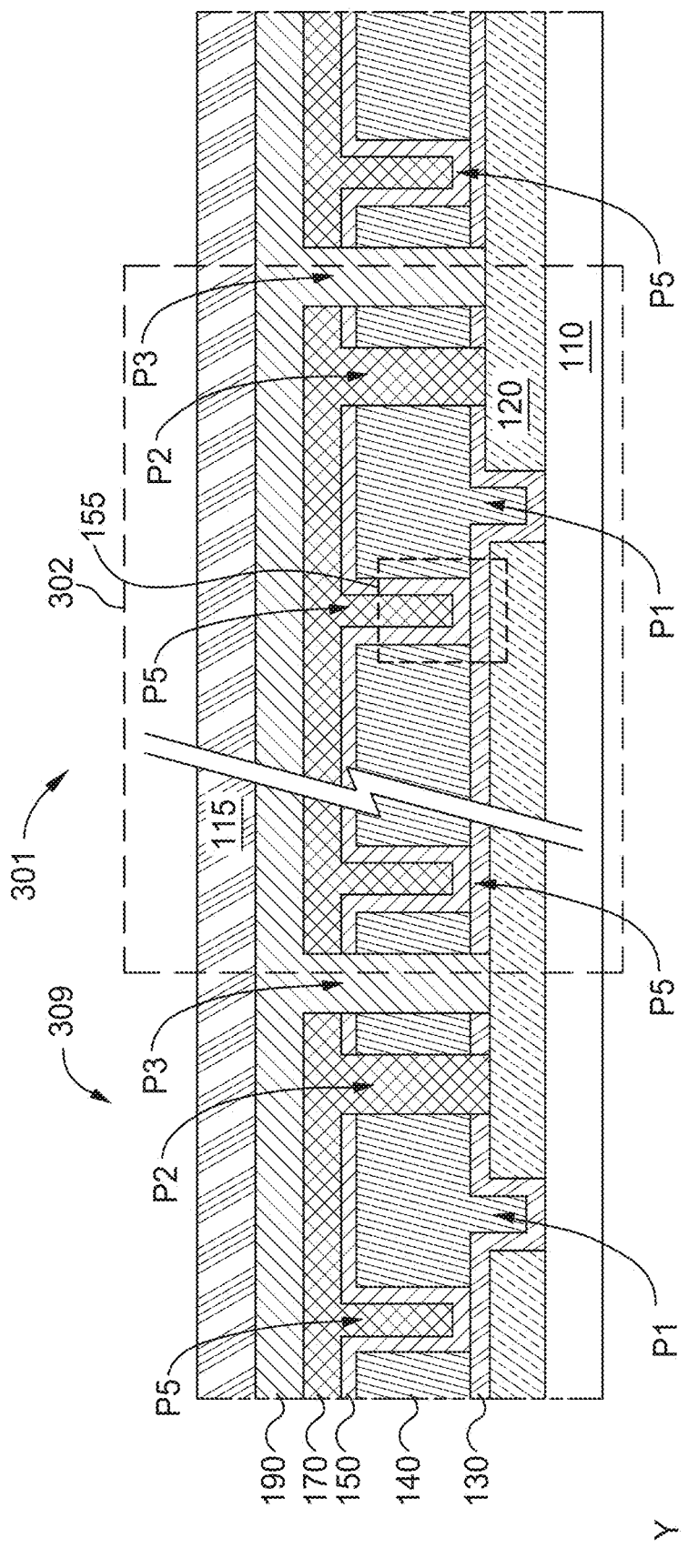
FIG. 3E illustrates a schematic side cross-sectional view of a portion of the array of PV cells of FIG. 3D according to one or more embodiments.

FIG. 3E illustrates a schematic side cross-sectional view of a portion of the photovoltaic device array 301, which includes a sectioned portion of the photovoltaic device array 301 formed by the sectioning line 3E-3E shown in FIG. 3D. The sectioned portion of the photovoltaic device array 301 shown in FIG. 3D illustrates a configuration of a plurality of features, such as the first scribe line P1, the second scribe line P2, the third scribe line P3, the fourth scribe line P4, and the features P5 implemented as dots. The photovoltaic device array 301, shown in FIG. 3E, includes the first substrate layer 110, the first contact layer 120, the first CTL 130, the absorber layer 140, the second CTL 150, the second contact layer 170, a plurality of features, the encapsulation layer 190, and the second substrate layer 115. In some embodiments, as shown in FIG. 3E, the features P5 are dots that extend through the absorber layer 140. Therefore, the diode region 155 includes in order, from bottom-to-top of the diode region 155, the first contact layer 120, the first charge transport layer (CTL) 130, the second charge transport layer (CTL) 150, and the second contact layer 170. Although the feature P5 is shown as extending through the entire absorber layer 140, in some embodiments, it is understood that the features P5 may extend through only a portion of the absorber layer 140.

Although the configurations shown in FIGS. 3B, 3C, 3E, and 3F illustrate that the features P5 (lines or dots) extend through the absorber layer 140, it is understood that features P5 may be formed in (i.e. extend through) other layers in addition to the absorber layer 140. This will be described in more detail below.

As described above, any suitable quantity and/or size of the feature P5 that limits both the loss to the current generating area, or absorption area which affects the geometric fill factor and open circuit voltage, due to the presence of the features P5 within each corresponding photovoltaic cell 302 while still being able to pass the full operational current generated within the photovoltaic device array 301 during a shading event during operation of the photovoltaic device array 301.

Figure 3F:
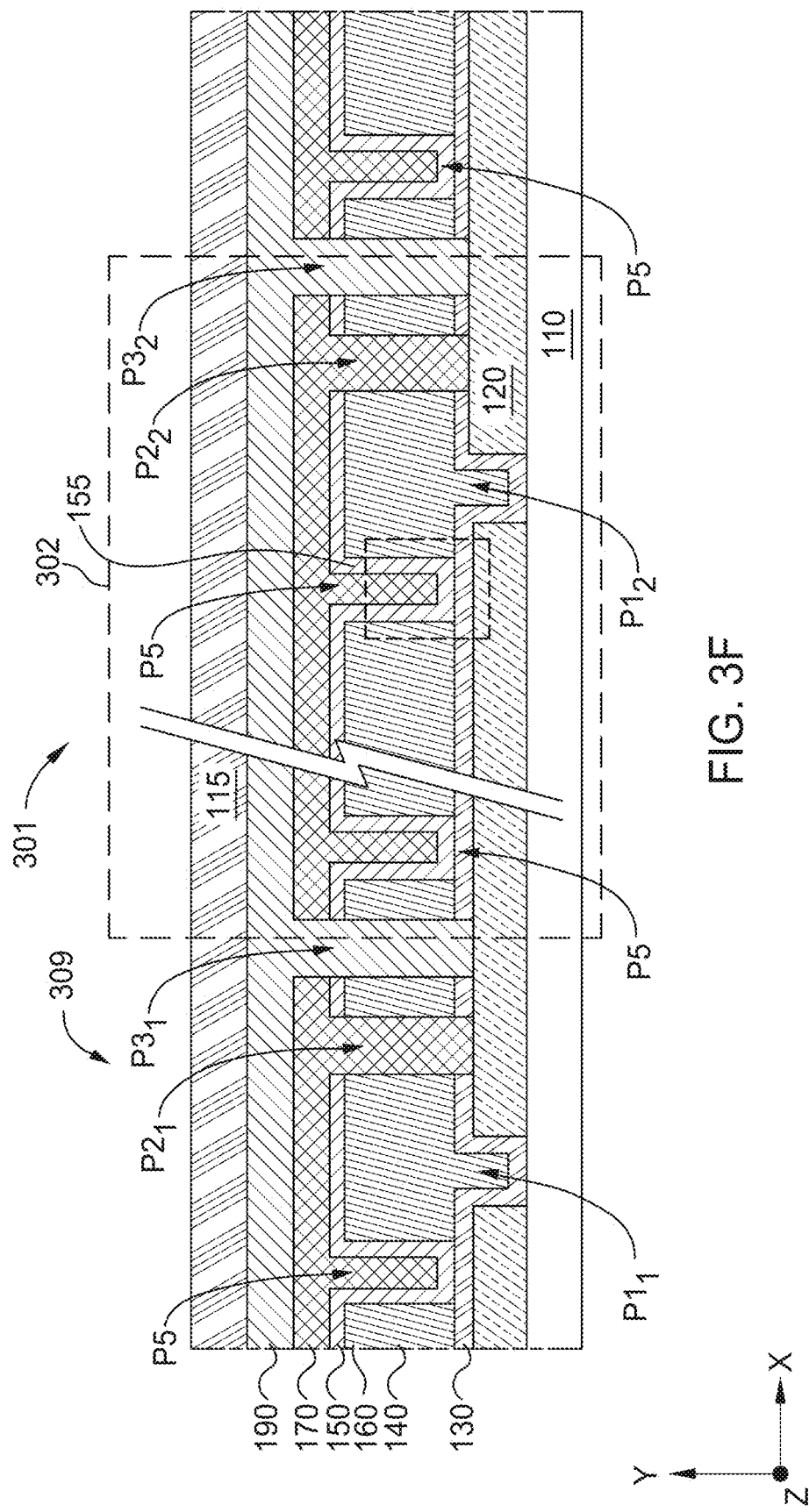
FIG. 3F illustrates a schematic side cross-sectional view of a portion of an alternately configured array of PV cells according to one or more embodiments.

FIG. 3F illustrates a schematic side cross-sectional view of a portion of an alternately configured photovoltaic device array 301, which includes a sectioned portion of the photovoltaic device array 301 formed by the sectioning line 3F-3F shown in FIG. 3D. The sectioned portion of the photovoltaic device array 301 shown in FIG. 3F illustrates an alternative configuration which similarly includes the plurality of features illustrated and described in relation to FIG. 3E. The photovoltaic device array 301, shown in FIG. 3F, additionally includes a buffer layer 160 that can be disposed between the absorber layer 140 and second CTL 150, or between the second CTL 150 and the second contact layer 170.

In the same manner described above, if the buffer layer 160 is formed between the absorber layer 140 and the second CTL 150, the buffer layer 160 may also be included in the diode region 155 even if the feature P5 is a dot, such as a circular, oval or other geometrically shaped feature. For example, in the configuration of FIG. 3E in which the feature P5 extends through the absorber layer 140, the buffer layer 160 is included in the diode region 155.

In some embodiments, a photovoltaic device array 301 includes a first substrate layer 110, a first contact layer 120, a first CTL 130, an absorber layer 140, a second CTL 150, a buffer layer 160, a second contact layer 170, a plurality of features, one or more barrier layers 180, an encapsulation layer 190, and a second substrate layer 115. In one configuration, as shown in FIGS. 3C and 3E, the buffer layer 160 is disposed between absorber layer 140 and the second CTL 150, but other photovoltaic device stack configurations can benefit from the disclosure provided herein.

Example Method for Forming a Photovoltaic Device

Figure 4:
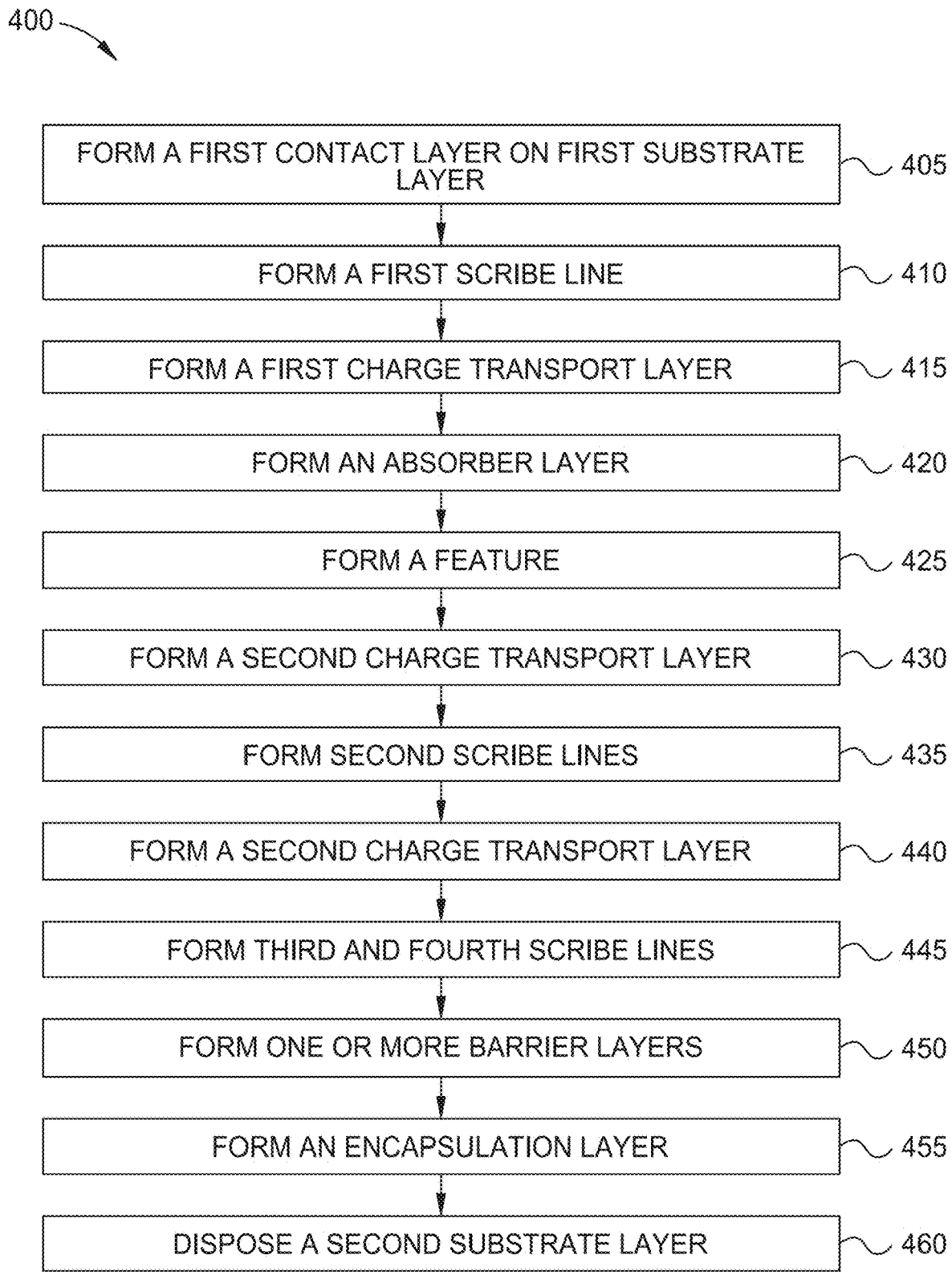
FIG. 4 illustrates a method of fabricating a PV cell device stack within the photovoltaic module according to one or more embodiments.

FIG. 4 illustrates a method 400 of fabricating a photovoltaic cell 500 that is positioned within the photovoltaic device array 301 of the photovoltaic device 300 according to one or more embodiments. FIGS. 5A-5K illustrate schematic cross-sectional views of the photovoltaic cell 500 during various stages of the fabrication of the photovoltaic device 300 which relate to the operations found in method 400 illustrated in FIG. 4. FIGS. 5A-5H illustrate schematic cross-sectional views of the photovoltaic cell 500 during various stages of fabrication as viewed by the sectioning line 3B-3B in FIG. 3A. FIGS. 5I-5K illustrate schematic cross-sectional views of the photovoltaic cell 500 as viewed by the sectioning lines 5I-5I, 5J-5J and 5K-5K, respectively, in FIG. 3A.

Figure 5A:
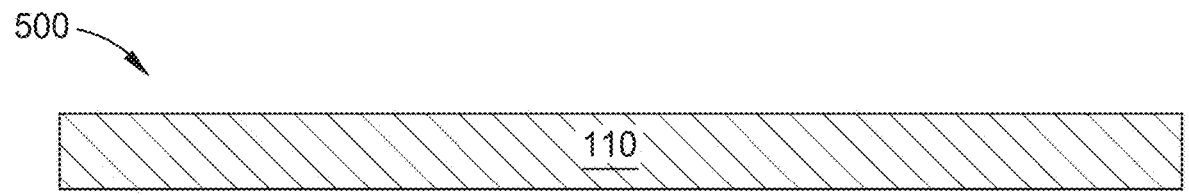
FIGS. 5A-5K illustrate schematic cross-sectional views of the photovoltaic cell device stack during various stages of the fabrication of the photovoltaic module which relate to the operations found in the method illustrated in FIG. 4 according to one or more embodiments.

Referring to FIG. 5A, the photovoltaic cell 500 includes the first substrate layer 110. The first substrate layer 110 has a first substrate thickness between about 50 µm to about 10 mm. In some embodiments, the first substrate layer 110 can include one or more materials selected from a group that includes a metal foil, silicon, glass, and/or a polymer substrate. In some embodiments, the first substrate layer 110 can include glass with a thickness between about 1 and 5 mm, more preferably between 2 and 3.2 mm. In some embodiments, the first substrate layer 110 can include metal foil and/or a polymer with a thickness between about 50 μm and 500 μm, more preferably between 40 μm and 150 μm. The first substrate layer 110 can include a roughened surface on which the various layers of the photovoltaic device stack are to be formed, wherein the roughened surface has a peak-to-valley roughness between about 1 nm to about 10 μm. For example, a peak-to valley roughness is about 1 micrometer (μm).

Figure 5B:
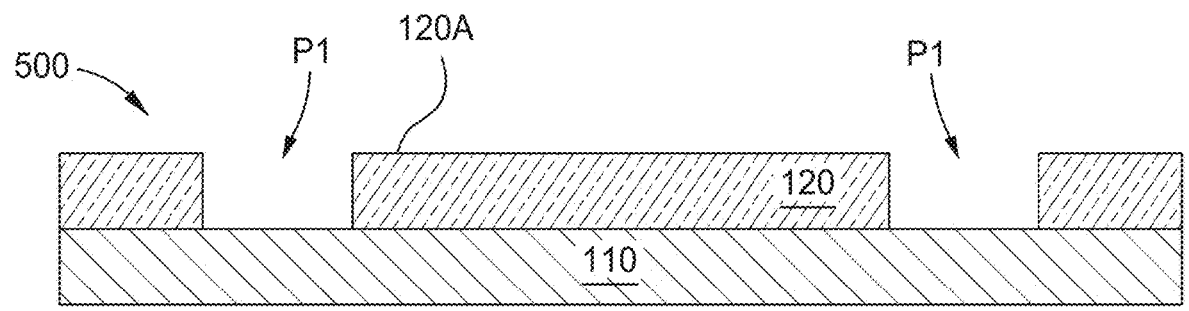

As illustrated in FIG. 5B, at operation 405 of the method 400, the first contact layer 120 is formed on a first surface of the first substrate layer 110. The first contact layer 120 includes an electrical contact layer material. The electrical contact layer material may include any suitable material, including, but not limited to, copper, silver, gold, indium tin oxide (ITO), fluorine doped tin oxide (FTO), indium zinc oxide (IZO), aluminum zinc oxide (AZO), or any combination thereof. In one example, the first contact layer 120 includes a transparent conductive oxide (TCO) layer, such as indium tin oxide (ITO), fluorine doped tin oxide (FTO), indium zinc oxide (IZO), or aluminum zinc oxide (AZO). In some embodiments, the first contact layer 120 may have include one or more layers, where each layer of the plurality of layers includes a contact layer material, such as a transparent conductive oxide layer. The first contact layer 120 can have a first contact thickness between about 5 nanometers (nm) to about 1000 nm, such as 100-300 nm, or about 150 nm. The first contact layer 120 may be formed by any suitable process including, but not limited to a physical vapor deposition (PVD) process (e.g., sputtering or evaporation processes), a chemical vapor deposition (CVD) process, plasma enhanced chemical vapor deposition (PECVD) process, an atomic layer deposition (ALD) process, a plasma enhanced atomic layer deposition (PEALD) process, or other suitable deposition technique.

At operation 410, as shown in FIG. 5B, the first contact layer 120 is patterned by performing a first scribing process in which the first scribe lines P1 are formed in the first contact layer 120. The first scribe lines P1 are formed so that each P1 scribe extends through the first contact layer 120 and at least to the surface of the first substrate layer 110 to form electrically isolated regions 120A that are bounded by the first scribe lines P1 and include portions of the first contact layer 120. As shown in FIG. 5B, the first scribe line P1 divides the first contact layer 120 into two separate electrically isolated regions 120A. The first scribe lines P1 can include a plurality of scribe lines that are spaced apart in a parallel relationship in a first direction (e.g., X-direction). The first scribe line P1 may be formed by any suitable process, including, but not limited to, mechanical scribing systems, laser ablation, or combination thereof.

Figure 5C:
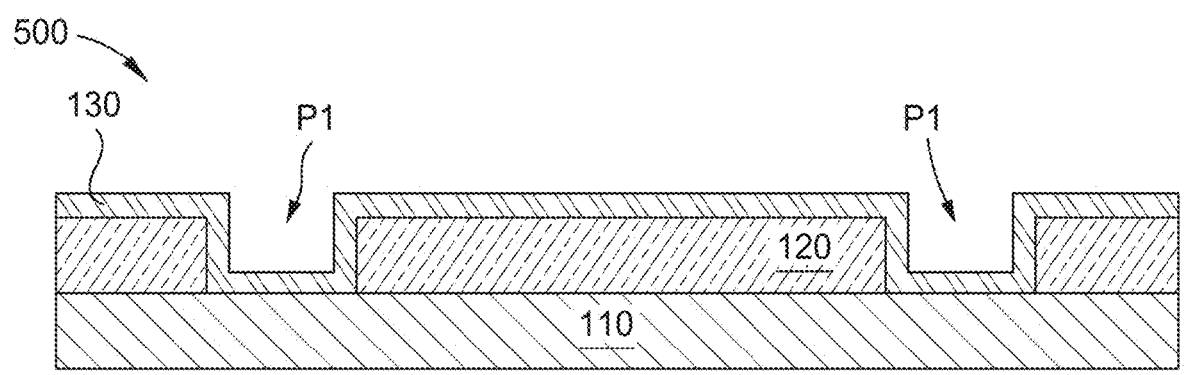

As shown in FIG. 5C, at operation 415, a first charge transport layer (CTL) 130 is formed over the patterned first contact layer 120. The first CTL 130 is disposed over the patterned portions of the first contact layer 120, the exposed sidewall surfaces of the first scribe lines P1, and the exposed portion of the first substrate layer 110. The first CTL 130 has a first CTL thickness between about 0.1 nm to about 10 μm, preferably between about 1 to 100 nm, more preferably between 10 to 70 nm. The first CTL 130 may be formed by any suitable process including, but not limited to a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., evaporation process), or other suitable deposition technique.

In some embodiments, the first CTL 130 may be configured to act as a hole transport layer (HTL) including a hole transport material, or to act as an electron transport layer (ETL) including an electron transport material. In some embodiments, the first CTL 130 may include a plurality of layers, where each layer of the plurality of layers may include a different material dependent upon the configuration (e.g., HTL versus ETL) of the first CTL 130. The first CTL 130 is an HTL that includes, but are not limited to, PTAA, Poly-TPD, nickel oxide, molybdenum oxide, OMATD, self-assembled monolayers (SAM), [2-(9H-carbazol-9-yl)ethyl]phosphonic acid (2PACz),(2-(3,6-Dimethoxy-9H-carbazol-9-yl)ethyl)phosphonic acid (MeO-2PACz), or (4-(3,6-Dimethyl-9H-carbazol-9-yl)butyl) phosphonic acid (Me-4PACz), (2-(3,6-Dibromo-9H-carbazol-9-yl)ethyl)phosphonic acid (Br-2PACz), or combinations thereof. As discussed above, in some embodiments, the first CTL 130, being configured to act as an HTL, may include a plurality of layers where each layer of the plurality of layers may include a different hole transport material. The different hole transport materials may include, but are not limited to, nickel oxide, PTAA, a SAM, or the like. For example, a multilayer HTL may include a plurality of layers where the plurality of layers comprise, nickel oxide and PTAA, nickel oxide and a SAM, a SAM and PTAA, or the like. As discussed above, in some embodiments, the first CTL 130, being configured to act as an ETL, may include a plurality of layers where each layer of the plurality of layers may include a different electron transport material. The different electron transport materials may include, but are not limited combinations of tin dioxide ($SnO_2$), a SAM, titanium dioxide ($TiO_2$), zinc oxide (ZnO), or the like. For example, a multilayer ETL may a plurality of layers, where the plurality of layers comprise $SnO_2$ and a SAM, $TiO_2$ and ZnO, or the like.

Figure 5D:
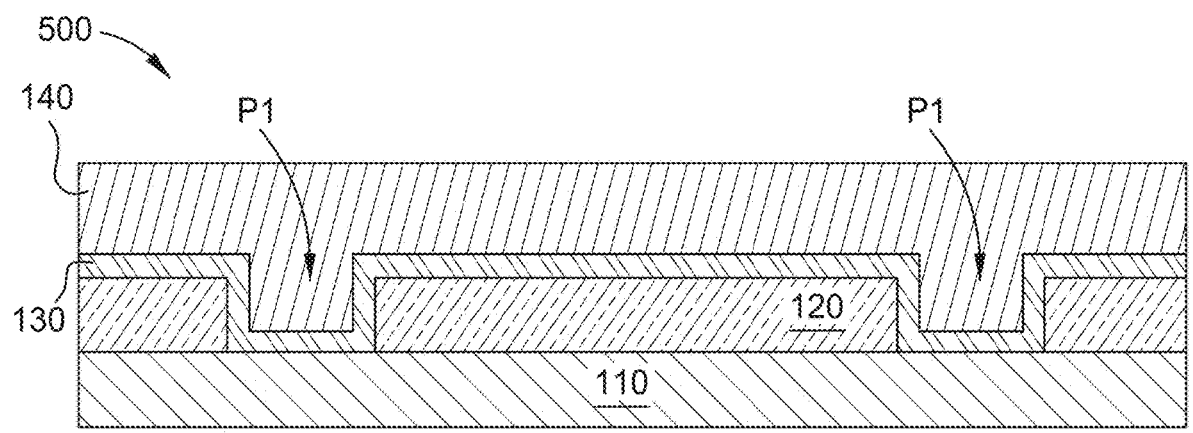

At operation 420, as shown in FIG. 5D, an absorber layer 140 is formed over the first CTL 130. In some embodiments, the absorber layer 140 is disposed on the first CTL 130. The absorber layer 140 includes an absorber material, the absorber material may include, a perovskite material. In one example, the absorber layer includes a perovskite material that has the stoichiometry of $ABX_3$, where A is a first cation, B is a second cation, and X comprises at least one halide (e.g., chloride, bromide, or iodide). In another example, the absorber layer 140 includes a perovskite that has a stoichiometry of $ABX_3$, where A comprises at least one of formamidinium (FA), methylammonium (MA), or cesium, and B comprises at least one of tin or lead, and X comprises at least one halide, methylammonium lead tri-iodide (MAPbl3), cesium formamidinium methylammonium lead tri-iodide (CsFAMAPbl3), silicon (amorphous and/or crystalline), Group Ill-V materials (amorphous and/or crystalline), organic photovoltaic materials (OPV), dye-sensitized PV cells (DSSX), copper indium gallium selenide (CIGS), cadmium telluride (CdTe), or combinations thereof.

The absorber layer 140 may be formed by any suitable solution based deposition process including, but not limited to printing, slot-die coating, spray-coating, gravure printing, or any combination thereof. The deposited absorber layer 140 has an absorber layer thickness between about 300 nm to about 1000 nm. For example, the absorber thickness is between about 450 nm to about 950 nm, preferably between about 500 nm to about 650 nm. In some embodiments, the absorber layer 140 may have an absorber thickness between about 1000 nm to about 2000 nm. In some embodiments, the absorber layer 140 fills, or at least partially fills the first scribe lines P1.

Figure 5E:
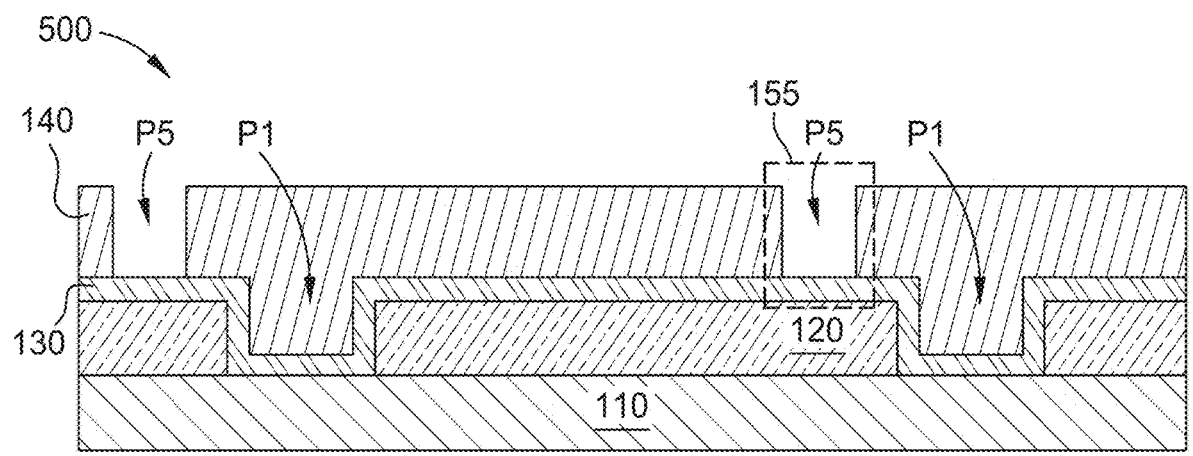

At operation 425, as shown in FIG. 5E, the feature P5 is formed through the absorber layer 140. For example, the feature P5 extends through at least the absorber layer 140 so that a diode region 155, when formed is in parallel electrically with the absorber layer 140. In some embodiments, the feature P5 exposes a portion of the first CTL 130. As shown in FIG. 5D, the feature P5 is a scribe line. However, as noted above, the feature P5 may include one or more dot shaped features. Also as noted above, the feature P5 may extend through the entire absorber layer 140 or at least a portion of the absorber layer 140.

For example, as shown in FIG. 5E, the absorber layer 140 is patterned by a patterning process including, but not limited to, a scribing process in which feature P5 extends through the absorber layer 140. The feature P5 may be formed by any suitable process, including, but not limited to, mechanical scribing systems, laser ablation, or combination thereof. As noted above any quantity of features P5 may be used so long as the quantity of diode regions 155 does not significantly affect the ability of the photovoltaic cell 500 to efficiently generate enough voltage and current during operation (e.g., provide a desirable geometric fill factor and open circuit voltage) while still being able to pass the full operational current of the corresponding photovoltaic device 300 during a shading event. The quantity of features P5 also needs to be large enough so that when in reverse bias the generated bias is less than the breakdown voltage of the absorber layer 140 or at some other negative voltage in which the absorber layer 140 (perovskite) will not experience irreversible damage.

Figure 5F:
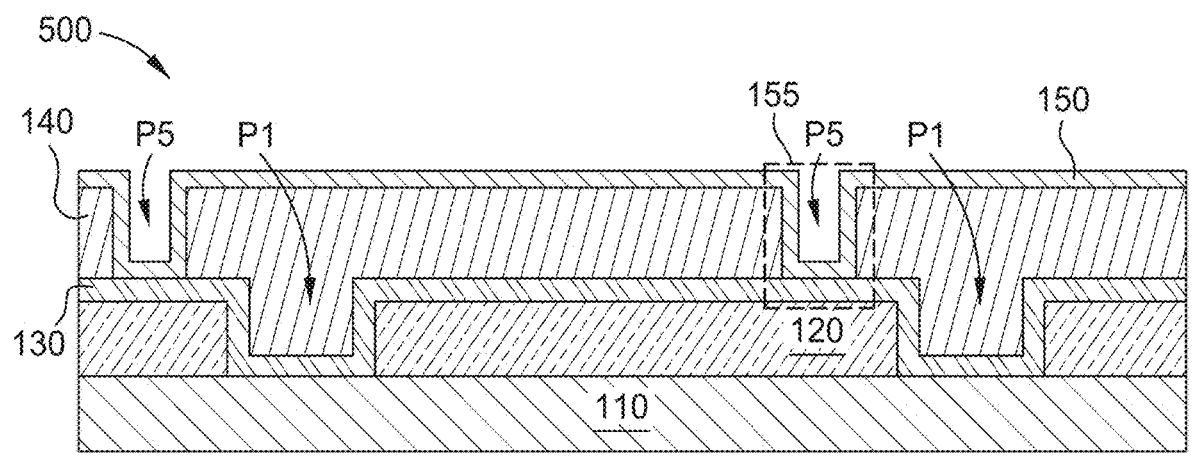

At operation 430, as shown in FIG. 5F, a second charge transport layer (CTL) 150 is deposited over the absorber layer 140. Because the feature P5 extends through the absorber layer 140, the second CTL 150 fills a portion of the feature P5 and is in direct contact with the first CTL 130. The second CTL 150 is disposed over the patterned portions of the absorber layer 140, the exposed sidewall surfaces of the feature P5, and the exposed portion of the first CTL 130. The second CTL 150 may be configured to act as a hole transport layer (HTL) including a hole transport material, or to act as an electron transport layer (ETL) including an electron transport material, which is an opposite type of layer as the first CTL 130. In some embodiments, the second CTL 150 may include a plurality of layers, where each layer of the plurality of layers may include a different material dependent upon the configuration (e.g., HTL versus ETL) of the second CTL 150. In one example, the second CTL 150 is an ETL that includes, but is not limited to, a metal oxide such as at least one of $TiO_2$, $SnO_2$, $Al_2O_3$, ZnO, or carbon contacts such as carbon nanotubes, fullerenes (e.g., Co and or $C_{70}$), a fullerene derivative [6,6]-phenyl-C61-butyric acid methyl ester (PCBM), or fullerenes used alone or in conjunction with bathocuproine (BCP) or $SnO_2$, or other metal oxide, or combination thereof. As discussed above, in some embodiments, the second CTL 150, being configured to act as an ETL, may include a plurality of layers where each layer of the plurality of layers may include a different electron transport material. In one embodiment, the second CTL 150 includes a first sub-CTL layer and a second sub-CTL layer. For example, a multilayer ETL may a plurality of layers where the plurality of layers comprise Co or a self-assembled-monolayer (SAM), Co or BCP, or the like. The second CTL 150 has a second CTL thickness between about 0.1 nm to about 1 μm. The second CTL 150 may be formed by any suitable process including, but not limited to vacuum evaporation, atomic layer deposition, sputtering, chemical vapor deposition, or combination thereof. In one or more embodiments, the first CTL 130 and the second CTL 150 may be different doped differently of layers. For example, the first CTL 130 may be an n-type layer and the second CTL may be a p-type layer (or vice versa).

In other embodiments, the second charge transport layer (CTL) 150 may be deposited over a buffer layer 160 formed over the absorber layer 140. Thus, the buffer layer 160 may be disposed over the exposed portions of the absorber layer 140. In another example, the buffer layer 160 may be formed between the second CTL 150 and the second contact layer 170. Thus, the buffer layer 160 may be disposed over the exposed portions of the second CTL 150. Stated differently, in examples in which the buffer layer 160 is included, the buffer layer 160 may fill a portion of the feature P5 and may be included in the diode region 155. In some embodiments, the buffer layer 160 has a thickness between about 0.1 nm to about 20 nm. The buffer layer 160 can comprise a material with a bandgap typically larger than the absorber layer 140 which may passivate the perovskite surface and/or slow the surface recombination rate, create a tunneling barrier, and/or otherwise change the interfacial properties between absorber layer 140 and the second CTL 150. The buffer layer 160 can comprise, but is not limited to, oxides, oxysalts, sulfates, organics, organic salts, and fluorides. The buffer layer 160 may be formed by any suitable process including, but not limited to a solution based deposition process, a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., evaporation process), or other suitable deposition technique. In one example, the deposited buffer layer 160 has a total thickness between about 0.4 nm to about 40 nm.

Figure 5G:
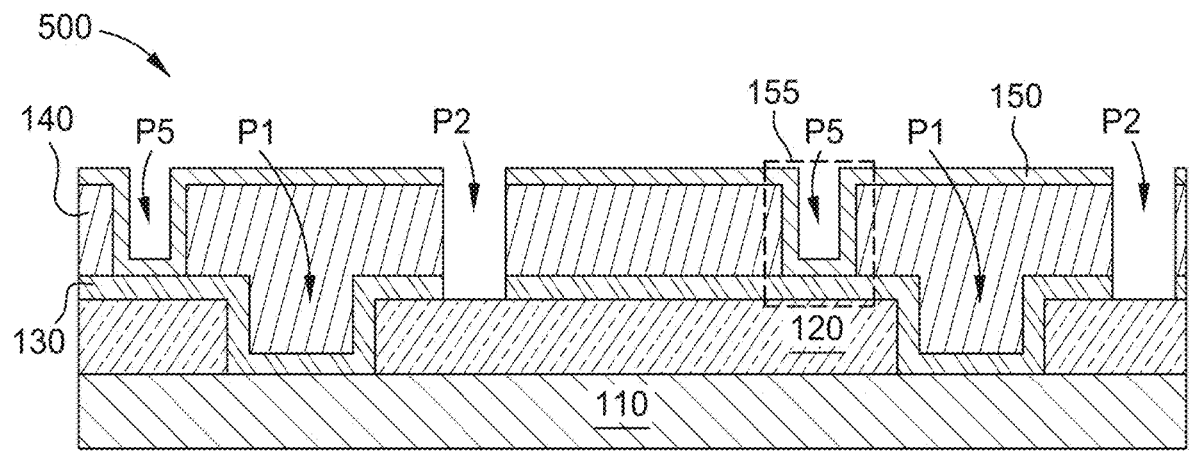

At operation 435, as shown in FIG. 5G, a plurality of second scribe lines P2 are formed (i.e., extend) through the first CTL 130, absorber layer 140, and the second CTL 150, and expose a portion of the first contact layer 120. In some embodiments, each of the formed second scribe lines P2 may extend into a portion of the first contact layer 120. The second scribe lines P2 each include a surface that contains portions of the second CTL 150, a portion of the absorber layer 140, a portion of the first CTL 130, and a portion of the first contact layer 120. The second scribe lines P2 may be formed by any suitable process, including, but not limited to, mechanical scribing systems, laser ablation, or combination thereof. The second scribe lines P2 are positioned on a first side (e.g., right side in FIG. 5G) of the first scribe lines P1 and the features P5 are formed on a side of the first scribe lines P1 that is opposite to the first side of the first scribe line P1 (e.g., left side in FIG. 5G).

Figure 5H:
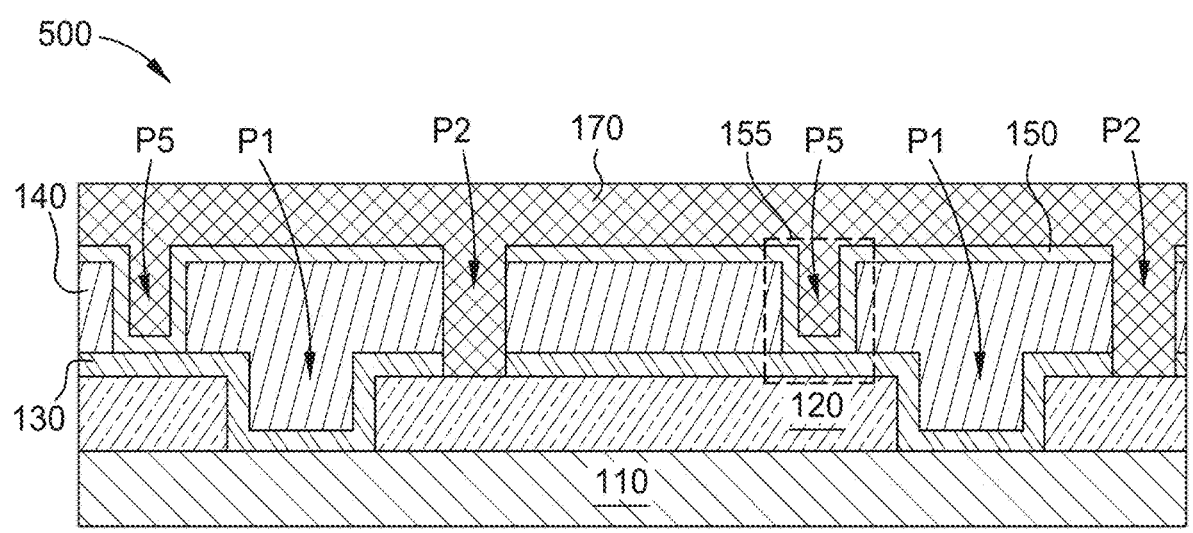
Figure 5I:
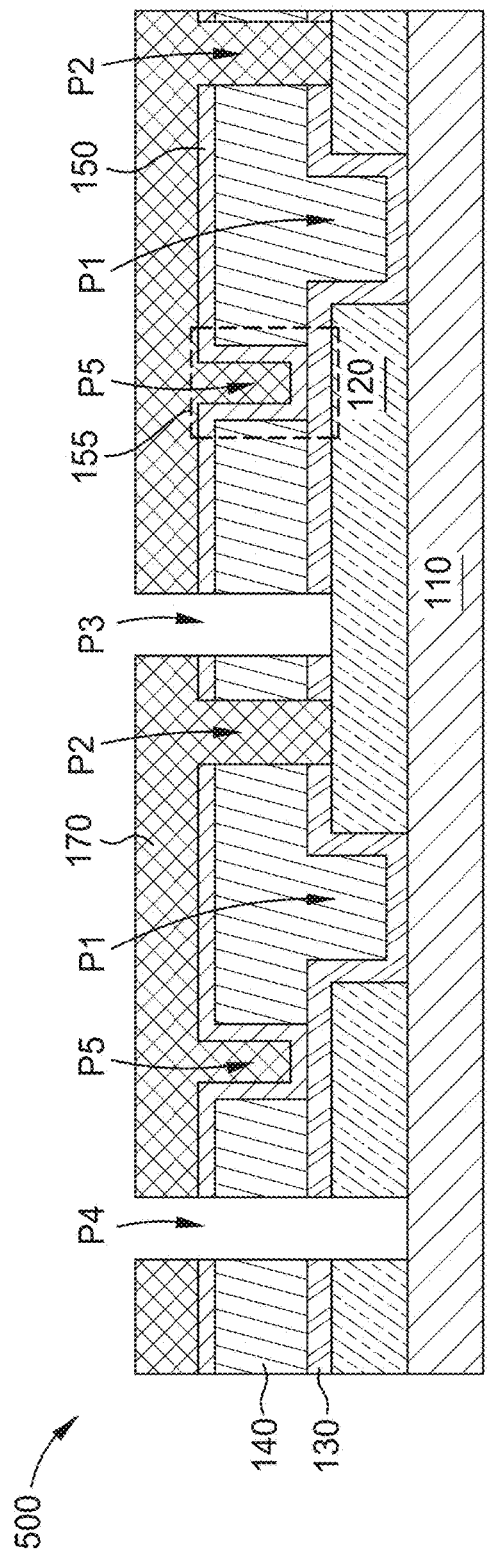
Figure 5J:
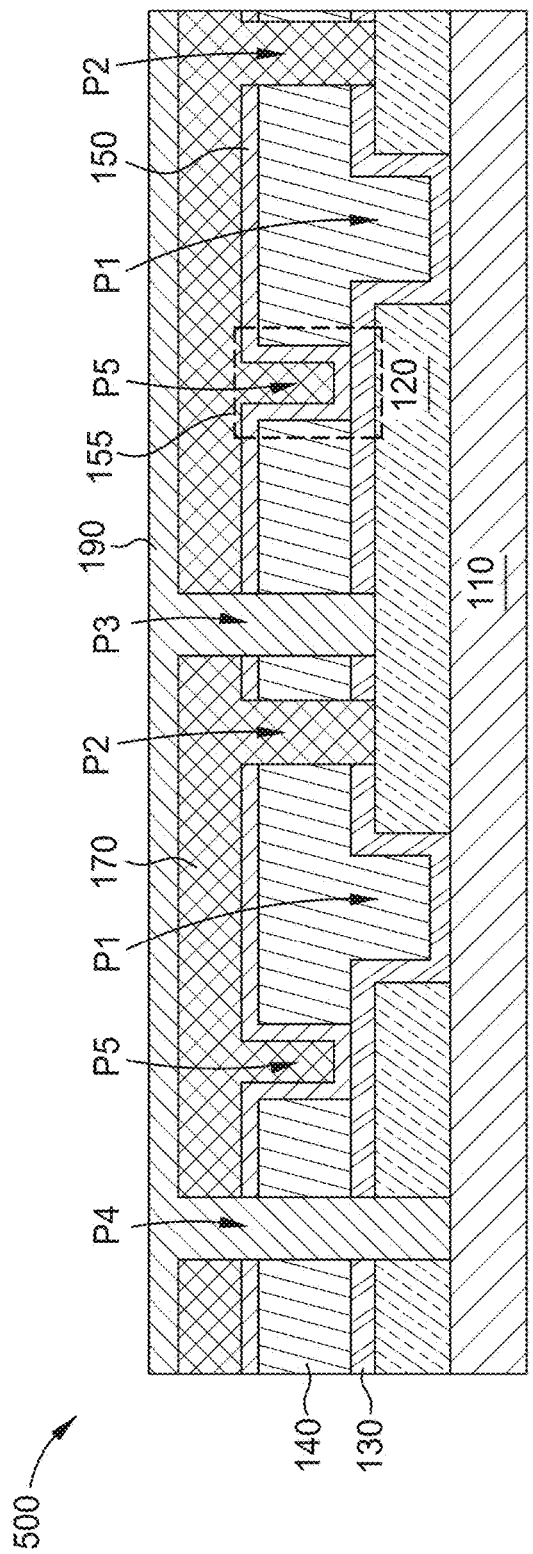
Figure 5K:
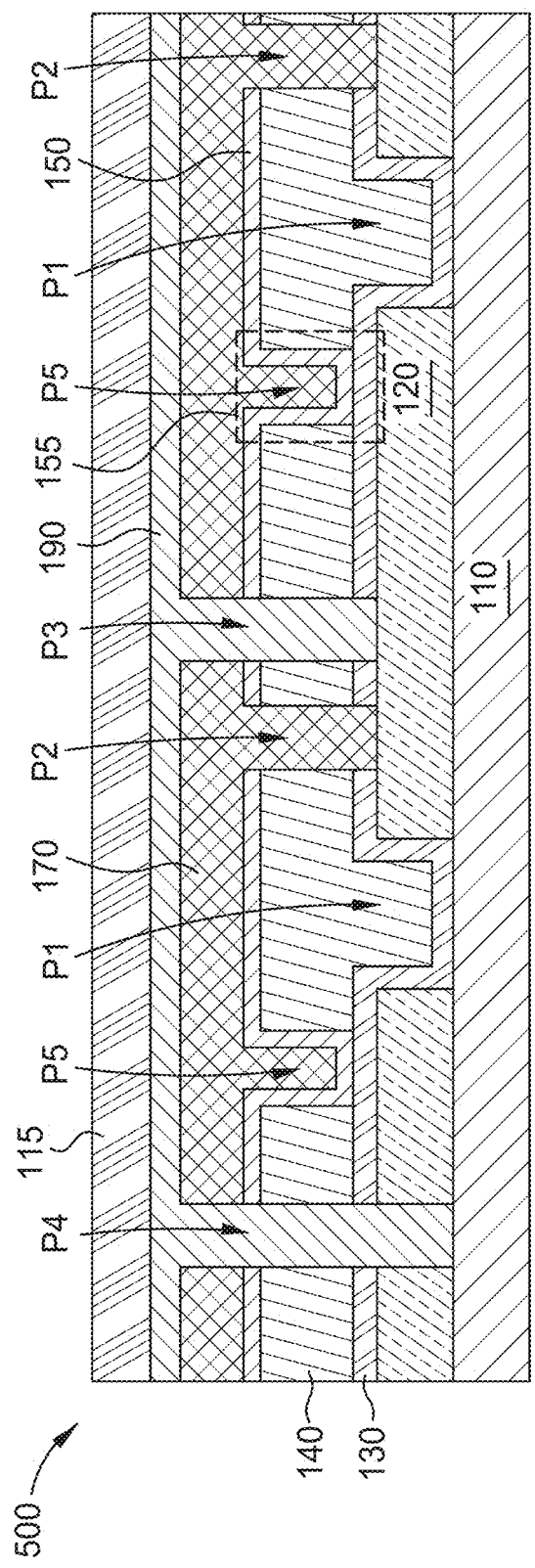

At operation 440, as shown in FIG. 5H, a second contact layer 170 is formed over the second CTL 150, absorber layer 140, first CTL 130, the first contact layer 120 and the first substrate layer 110. The second contact layer 170 is disposed over the second CTL 150 and fills at least a significant portion or all of the second scribe line P2. The second contact layer 170 may be formed from any suitable contact layer material as described above. In one example, the second contact layer 170 includes a TCO layer, such as an IZO or ITO layer. The second contact layer 170 has a first thickness of between about 5 nm to about 1000 nm. The second contact layer 170 may be formed by any suitable process including, but not limited to a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process, printing, spraying or other suitable deposition technique.

As illustrated in FIG. 5H, the second contact layer 170 also fills the remaining portion of the feature P5, forming the diode region 155. Therefore, as shown in FIG. 5H, the diode region 155 includes the first contact layer 120, the first CTL 130, the second CTL 150, and the second contact layer 170. Advantageously, and as noted above, the diode region 155 is perovskite-free and may be used to shunt current away from the absorber layer 140 during a shading event. Stated otherwise, as noted above because the first CTL 130 is an n-type layer and the second CTL 150 is a p-type layer (or vice versa), a P-N junction type diode is formed in the diode region 155. The diode region 155 along the with conductive portions of both contact layers allow current to bypass the absorber layer 140 which prevents the PV cell from entering breakdown during a shading event.

At operation 445, as shown in FIG. 5I a plurality of third scribe lines P3 and a plurality of fourth scribe lines P4 are formed through portions of the photovoltaic device stack. Each of the third scribe lines P3 extends through the second contact layer 170, the second CTL 150, and at least a significant portion of the absorber layer 140. In some embodiments, as shown in FIG. 5H, the third scribe lines P3 extends through the second contact layer 170, the second CTL 150, the absorber layer 140, and the first CTL 130, and expose a portion of the first contact layer 120. In some embodiments, the third scribe line P3 may extend into a portion of the first contact layer 120. The third scribe lines P3 each include a surface that contains portions of the second contact layer 170, the second CTL 150, the buffer layer 160, the absorber layer 140, the first CTL 130, and the first contact layer 120. The third scribe lines P3 may be formed by any suitable process, including, but not limited to, mechanical scribing systems, laser ablation, or combination thereof. In some examples of the present disclosure, the third scribe lines P3 may each have a width between 5 μm and 200 μm. The third scribe lines P3 are positioned on the first side (e.g., right side in FIG. 5G) of the first scribe lines P1 and the second scribe line P2. The features P5 are formed between the third scribe lines P3 and first scribe lines P1 in adjacent PV cells (e.g., a first scribe line P1 on the right side of the originally described first scribe lines P1 in FIG. 5G).

During operation 445, the plurality of fourth scribe lines P4 are formed through the device layer stack. The fourth scribe lines P4, extend through the second contact layer 170, the second CTL 150, the absorber layer 140, the first CTL 130, and the first contact layer 120 and generally to the top surface of the first substrate layer 110. In some embodiments, the fourth scribe line P4 may extend into the first substrate layer 110. The fourth scribe lines P4 are separate from the third scribe lines P3 and are used to isolate the photovoltaic device array from the unusable edge portions of the photovoltaic device 300 formed at the edge of the first substrate layer 110 of the photovoltaic device 300. In some embodiments the fourth scribe lines P4 may be wide enough to extend to the edge of the photovoltaic device 300. The fourth scribe lines P4 each include a surface that contains portions of the second contact layer 170, the second CTL 150, buffer layer 160, the absorber layer 140, the first CTL 130, the first contact layer 120, and the first substrate layer 110. The fourth scribe lines P4 may be formed by any suitable process, including, but not limited to, mechanical scribing systems, laser ablation, or combination thereof.

At operation 450, as shown in FIG. 5J, an encapsulation layer 190 is disposed and/or formed over the device layer stack. As shown in FIG. 5I, the encapsulation layer 190 is disposed over the second contact layer 170 and fills the voids created by the third scribe lines P3 and the fourth scribe lines P4. The encapsulation layer 190 includes an encapsulation material. The encapsulation material may include, but is not limited to, ethylene vinyl acetate (EVA), polyolefin, polyurethane, polyvinyl butyral, ionomers or combination thereof. The encapsulation layer 190 has an encapsulation thickness between about 0.1 mm to about 5 mm. The encapsulation layer 190 may be formed by any suitable process including, but not limited to, a lamination process, casting, an autoclave process, or other common deposition and/or attachment techniques.

In some embodiments, prior to operation 450 one or more barrier layers may be formed over the device stack. For example, the one or more barrier layers (e.g., one or more barrier layers 180) may be deposited over the second contact layer 170 and the exposed surfaces of the third scribe lines P3 and the fourth scribe lines P4, and partially fill the openings formed by the third scribe lines P3 and the fourth scribe lines P4. The encapsulation layer 190 may be formed over the one or more barrier layers.

The one or more barrier layers include a barrier material. Each barrier layer of the one or more barrier layers may include a different barrier material. The barrier materials of the one or more barrier layers may include a metal oxide. In one example, the one or more barrier layers include, but are not limited to, a material that comprises aluminum oxide, silicon oxide, tin oxide, titanium oxide, zirconium oxide, or combination thereof. The barrier materials of the one or more barrier layers may include a styrenic polymer, a polysiloxane, an amine-containing polymer, a polyacrylate, an aryl ammonium halide, an alkyl ammonium halide, a fluorinated hydrocarbon polymer, or a combination thereof. In another example, the one or more barrier layers include, but are not limited to, a styrenic polymer such as polystyrene (PS), acrylonitrile butadiene styrene (ABS), acrylonitrile-styrene-acrylate (ASA) or styrene-butadiene rubber (SBR). In another example, the one or more barrier layers include, but are not limited to, a polysiloxane such as poly(dimethylsiloxane), poly(diethylsiloxane) or poly(methylphenylsiloxane). In another example, the one or more barrier layers include, but are not limited to, a amine-containing polymer such as polyethylenimine (PEIE), poly(vinylamine) hydrochloride (PVH), or poly(ethylene glycol) bis(amine) (PEG-Amine). In another example, the one or more barrier layers include, but are not limited to, a polyacrylate such as polymethylmethacrylate (PMMA) or polyethylacrylate. In another example, the one or more barrier layers include, but are not limited to, an aryl ammonium halide such as phenethylammonium iodide (PEAI), 1-(ammonium acetyl) pyrene (PEY) or dodecyl ammonium-chloride (DACI). In another example, the one or more barrier layers include, but are not limited to, an alkyl ammonium halide such as n-propylammonium iodide (PAI), ethane-1,2-diammonium (EDA), 2-chloroethylamine (CEA) or 2-bromo-ethylamine (BEA). In another example, the one or more barrier layers include, but are not limited to, a fluorinated hydrocarbon polymer such as Nafion™, polytetrafluoroethylene, polyvinylidene-fluoride, or trifluoroethylene. The one or more barrier layers have a barrier thickness between about 1 nm to about 5 µm. The one or more barrier layers 180 may be conformally deposited by any suitable process, for example, a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., thermal evaporation), or solution processing methods such ink-jet printing, slot-die coating, spray-coating, gravure printing, blanket coating. In some embodiments, the solution processing methods include an annealing process.

At operation 460, as shown in FIG. 5K, a second substrate layer 115 is disposed on and/or coupled to the encapsulation layer 190. The second substrate layer 115 has a second substrate thickness between about 0.05 mm to about 5 mm. In some embodiments, as discussed above, second substrate layer 115 can include one or more materials selected from a group that includes a metal foil, silicon, glass, and/or a polymer substrate. In some embodiments, as discussed above, second substrate layer 115 is glass with a thickness between about 1 mm and 3 mm.

Alternative Photovoltaic Device Examples

Figure 6:
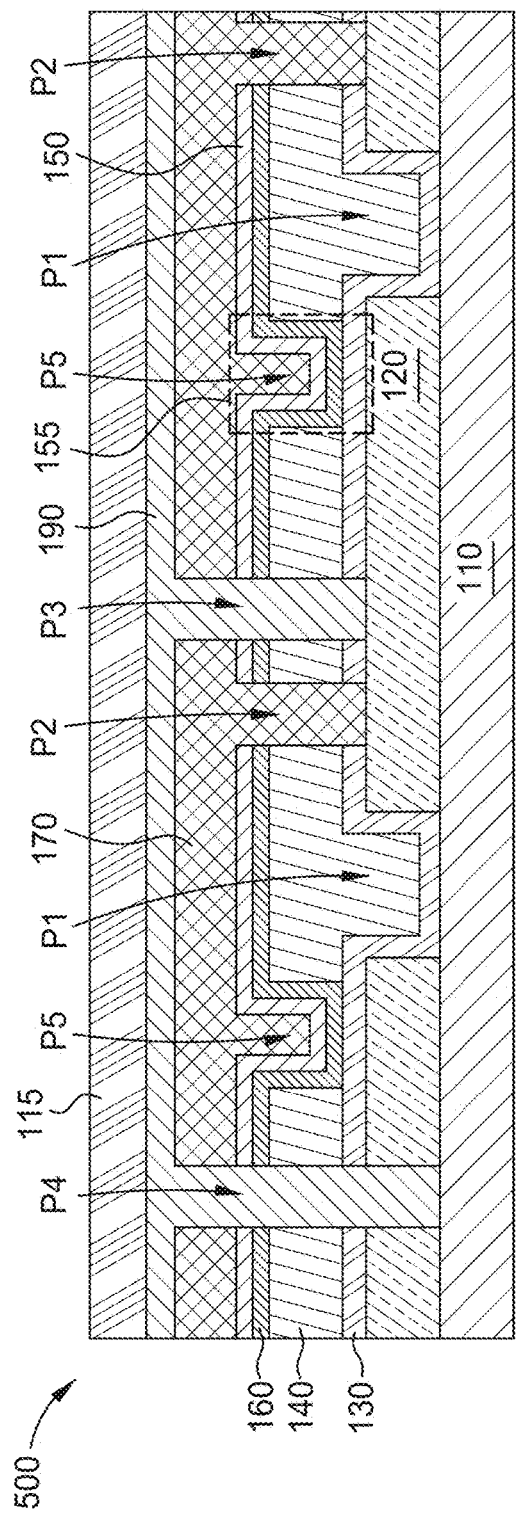
FIG. 6 illustrates a schematic side cross-sectional view of an array of PV cells that includes a photovoltaic cell according to one or more embodiments.

FIG. 6 illustrates a schematic side cross-sectional view the photovoltaic cell 500 according to one or more embodiments. In the configuration of FIG. 6 operation 425 can be performed between operations 430 and 435, or between operations 435 and 440. For example, as shown in FIG. 6, the feature P5 is formed after the second CTL 150 is formed. Thus, the feature P5 extends through the second CTL 150 and the absorber layer 140. Therefore, the diode region 155 includes, from top-to-bottom, the second contact layer 170, the first CTL 130, and the first contact layer 120. In the configuration shown in FIG. 6, if the buffer layer 160 is included, the feature P5 would also extend through the buffer layer 160 and the buffer layer 160 would not be included in the diode region 155. In one or more embodiments, the process of forming the feature P5 may remove portions of the first CTL 130 layer or incompletely remove portions of the absorber 140 layer.

Figure 7:
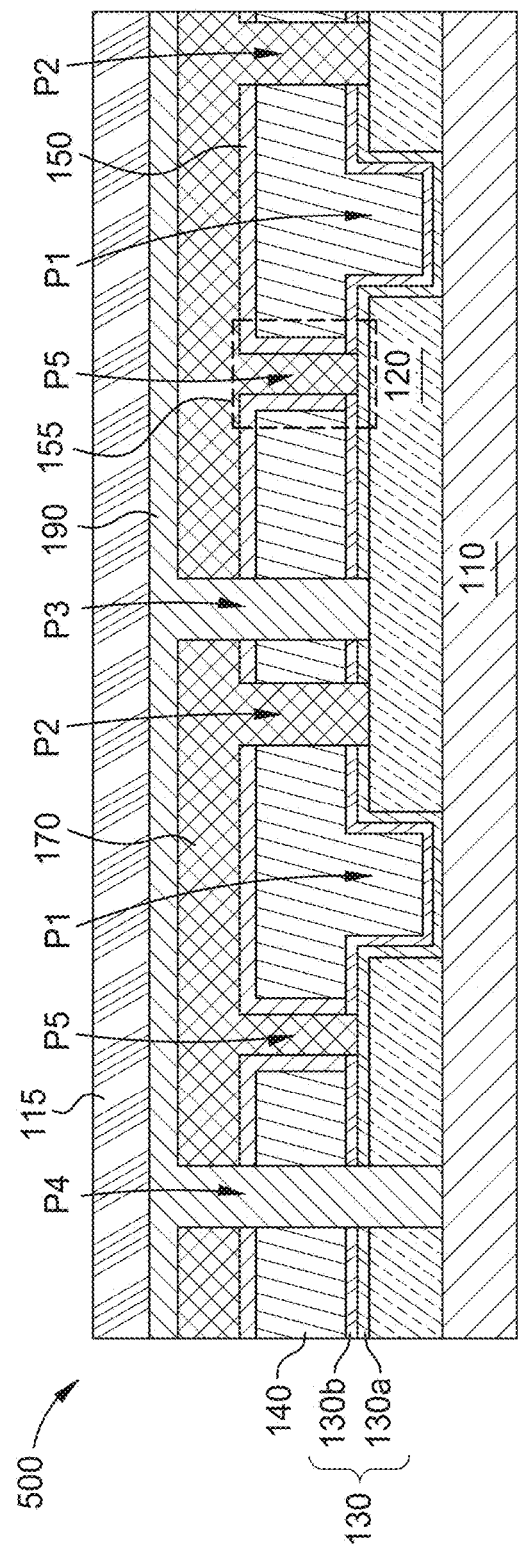
FIG. 7 illustrates a schematic side cross-sectional view of an array of PV cells that includes an alternately configured photovoltaic cell according to one or more embodiments.

FIG. 7 illustrates a schematic side cross-sectional view the photovoltaic cell 500 according to one or more embodiments. In the configuration of FIG. 7 the first CTL 130 includes two or more sub-layers such as a first sub-layer 130A and a second sub-layer 130B. The first sub-layer 130A and the second sub-layer 130B may include different materials. However, in some cases it may be desirable to form the first sub-layer 130A and the second sub-layer 130B from the same material while forming each sub-layer using one or more different deposition process parameters. The first sub-layer 130A and the second sub-layer 130B may comprise any of the first CTL 130 materials discussed above. In one or more embodiments, operation 425 can be performed between operations 430 and 435, or between operations 435 and 440. For example, as shown in FIG. 7, the feature P5 is formed after the second CTL 150 and extends deeper into the photovoltaic cell 500. Therefore, the feature P5 extends through the second CTL 150, the absorber layer 140, and at least a portion of the first CTL 130, such as the first sub-layer 130A Therefore, the diode region 155 includes, from top-to-bottom, the second contact layer 170, and a portion of the first CTL 130 (such as the first sub-layer 130A). In the configuration shown in FIG. 6, if the buffer layer 160 is included, the feature P5 would also extend through the buffer layer 160 and the buffer layer 160 would not be included in the diode region 155.

ADDITIONAL CONSIDERATIONS

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined, or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

As used herein, "gas" and "fluid" may be used interchangeable with either term generally referring to elements, compounds, materials, etc., having the properties of a gas, a fluid, or both a gas and a fluid.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward," "horizontal," "vertical," and the like do not refer to absolute directions. Instead, these terms refer to directions relative to a nonspecific plane of reference. This non-specific plane of reference may be vertical, horizontal, or other angular orientation.

The singular forms "a", "an", and "the", include plural referents, unless the context clearly dictates otherwise. Within a claim, reference to an element in the singular is not intended to mean "one and only one" unless specifically so stated, but rather "one or more". Unless specifically stated otherwise, the term "some" refers to one or more.

Embodiments of the present disclosure may suitably "comprise", "consist", or "consist essentially of", the limiting features disclosed, and may be practiced in the absence of a limiting feature not disclosed. As used here and in the appended claims, the words "comprise", "has", and "include", and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

"Coupled" and "coupling" means that the subsequently described material is connected to previously described material. The connection may be a direct, or indirect connection, and may, or may not, include intermediary components such as plumbing, wiring, fasteners, mechanical power transmission, electrical communication, wired and/or wireless transmission, etc., which may suitable to affect operation of the components.

When the word "approximately" or "about" are used, this term may mean that there may be a variance in value of up to +10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112(f), for any limitations of any of the claims, except for those in which the claim expressly uses the words 'means for' together with an associated function.

While the foregoing is directed to examples of the present disclosure, other and further examples of the disclosure may be devised without departing from the basic scope thereof, and the scope thereof is determined by the claims that follow.

What is claimed is:

1. A photovoltaic device comprising:
   a plurality of photovoltaic cells coupled in series, wherein each of the photovoltaic cells comprise:
   a first contact layer;
   a first charge transport layer (CTL) disposed over the first contact layer;
   an absorber layer disposed over the first CTL;
   a second charge transport layer (CTL) disposed over the absorber layer; and
   a second contact layer disposed over the second CTL,
      wherein each photovoltaic cell in the plurality of photovoltaic cells includes a diode region that comprises a feature,
      wherein the feature extends through the absorber layer and comprises a portion of the first CTL and a portion of the second CTL,
      wherein the diode region essentially comprises the first contact layer, the first CTL, the second CTL, and the second contact layer,
      wherein the first CTL and the second CTL are in direct contact with each other within the diode region.

2. The photovoltaic device of claim 1, wherein the feature comprises a scribe line that comprises a trench shaped structure or a dot that comprises a circular or oval shaped structure.

3. The photovoltaic device of claim 1, further comprising scribe lines that extend through the first contact layer and form electrically isolated regions of the first contact layer.

4. The photovoltaic device of claim 3, wherein the feature further comprises scribe lines that extend through the first CTL, the absorber layer, and the second CTL and are filled with the second contact layer.

5. The photovoltaic device of claim 1, further comprising scribe lines that extend through the second contact layer, the second CTL, the absorber layer, and the first CTL, and are filled with an encapsulation layer that is disposed over the second contact layer.

6. The photovoltaic device of claim 1, further comprising scribe lines that extend through the second contact layer, the second CTL, the absorber layer, the first CTL, and the first contact layer and are filled with an encapsulation layer that is disposed over the second contact layer.

7. The photovoltaic device of claim 1, further comprising a buffer layer disposed between the absorber layer and the second CTL or disposed between the second CTL and the second contact layer.

8. The photovoltaic device of claim 1, wherein the second CTL comprises a first sub-layer and a second sub-layer, and the first sub-layer is disposed between the absorber layer and the second sub-layer.

9. The photovoltaic device of claim 8, wherein the first sub-layer and the second sub-layer comprise a material selected from a group consisting of a metal oxide, carbon nanotubes, fullerenes, [6,6]-phenyl-C61-butyric acid methyl ester (PCBM), or bathocuproine (BCP), and the first sub-layer and the second sub-layer comprise different materials.

10. The photovoltaic device of claim 8, wherein the first sub-layer or the second sub-layer comprises a C60 fullerene.

11. A photovoltaic device comprising:
   a first photovoltaic cell, comprising:
   a first portion of a first contact layer;
   a first portion of a first charge transport layer (CTL) disposed over the first portion of the first contact layer;
   a first portion of an absorber layer disposed over the first portion of the first CTL;
   a first portion of a second charge transport layer (CTL) disposed over the first portion of the absorber layer; and
   a first portion of a second contact layer disposed over the first portion of the second CTL;

a second photovoltaic cell, comprising:
  a second portion of the first contact layer;
  a second portion of the first charge transport layer (CTL) disposed over the second portion of the first contact layer;
  a second portion of the absorber layer disposed over the second portion of the first CTL;
  a second portion of the second charge transport layer (CTL) disposed over the second portion of the absorber layer; and
  a second portion of the second contact layer disposed over the second portion of the second CTL;
a first P1 scribe line disposed between the first and second portions of the first contact layer;
a first P3 scribe line extending through the first portion of the first CTL, the first portion of the absorber layer, the first portion of the second CTL, and the first portion of the second contact layer; and
one or more first diode regions,
  wherein the one or more first diode regions each comprise a feature that is positioned between the first P3 scribe line and the first P1 scribe line,
  wherein the one or more first diode regions extend through the first portion of the absorber layer,
  wherein the one or more first diode regions comprise the first CTL and the second CTL, and
  wherein the one or more first diode regions each comprise the first contact layer, the first CTL, the second CTL, and the second contact layer,
  wherein the first CTL and the second CTL are in direct contact with each other within the one or more diode regions.

12. The photovoltaic device of claim 11, wherein the feature comprises a scribe line that comprises a trench shaped structure or a dot that comprises a circular or oval shaped structure.

13. The photovoltaic device of claim 11, further comprising:
  a second P1 scribe line defining an extent of the second portion of the first contact layer;
  a second P3 scribe line extending through the second portion of the first CTL, the second portion of the absorber layer, the second portion of the second CTL, and the second portion of the second contact layer; and
  one or more second diode regions, wherein
    the one or more second diode regions each comprise the feature that is positioned between the second P3 scribe line and the second P1 scribe line,
    the one or more second diode regions extend through the second portion of the absorber layer, and
    the one or more second diode regions comprise the first CTL and the second CTL.

14. The photovoltaic device of claim 13, wherein the first and second P3 scribe lines comprise an encapsulation layer that is disposed over the first and second portion of the second contact layer.

15. The photovoltaic device of claim 11, wherein the first P3 scribe line extends through the first portion of the second contact layer, the first portion of the second CTL, the first portion of the absorber layer, the first portion of the first CTL, and the first portion of the first contact layer and is filled with an encapsulation layer.

16. The photovoltaic device of claim 11, further comprising a buffer layer disposed between
  the first portion of the absorber layer and the first portion of the second CTL and the second portion of the absorber layer and the second portion of the second CTL, or
  the first portion of the second CTL and the first portion of the second contact layer and the second portion of the second CTL and the second portion of the second contact layer.

17. The photovoltaic device of claim 11, wherein the second CTL comprises a first sub-layer and a second sub-layer, and the first sub-layer is disposed between the absorber layer and the second sub-layer.

18. The photovoltaic device of claim 17, wherein the first sub-layer and the second sub-layer comprise a material selected from a group consisting of a metal oxide, carbon nanotubes, fullerenes, [6,6]-phenyl-C61-butyric acid methyl ester (PCBM), or bathocuproine (BCP), and the first sub-layer and the second sub-layer comprise different materials.

19. The photovoltaic device of claim 17, wherein the first sub-layer or the second sub-layer comprises a C60 fullerene.

20. A photovoltaic device comprising:
a plurality of photovoltaic cells coupled in series, wherein each of the photovoltaic cells comprise:
  a first contact layer;
  a first charge transport layer (CTL) disposed over the first contact layer;
  an absorber layer disposed over the first CTL;
  a second charge transport layer (CTL) disposed over the absorber layer; and
  a second contact layer disposed over the second CTL,
    wherein each photovoltaic cell in the plurality of photovoltaic cells includes a diode region that comprises a feature comprising trench, circular or oval shaped structures,
    wherein the feature extends through the absorber layer and comprises a portion of the first CTL and a portion of the second CTL,
    wherein the diode region essentially comprises the first contact layer, the first CTL, the second CTL, and the second contact layer,
    wherein the first CTL and the second CTL are in direct contact with each other within the diode region.

* * * * *